United States Patent
Lee et al.

(10) Patent No.: US 11,688,686 B2
(45) Date of Patent: Jun. 27, 2023

(54) SEMICONDUCTOR DEVICE INCLUDING AN INPUT/OUTPUT CIRCUIT

(71) Applicant: Samsung Electronics Co., Ltd., Suwon-si (KR)

(72) Inventors: Woonki Lee, Yongin-si (KR); Minsic Kim, Seoul (KR); Seunghun Oh, Ulsan (KR); Jinhyeong Kim, Suwon-si (KR); Junyeong An, Suwon-si (KR); Jooyeon Lee, Suwon-si (KR); Sangwoo Pyo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/163,869

(22) Filed: Feb. 1, 2021

(65) Prior Publication Data

US 2022/0020682 A1 Jan. 20, 2022

(30) Foreign Application Priority Data

Jul. 14, 2020 (KR) .................. 10-2020-0086507

(51) Int. Cl.
*H01L 23/528* (2006.01)
*H01L 23/60* (2006.01)
(Continued)

(52) U.S. Cl.
CPC ........ *H01L 23/528* (2013.01); *H01L 23/5226* (2013.01); *H01L 23/60* (2013.01);
(Continued)

(58) Field of Classification Search
CPC ............. H01L 27/0248; H01L 27/0251; H01L 27/0296; H01L 23/60; H01L 23/5226; H01L 23/528; H01L 23/5283
See application file for complete search history.

(56) References Cited

U.S. PATENT DOCUMENTS 6,114,903 A 9/2000 Bach
6,117,694 A 9/2000 Smith et al.
(Continued)

FOREIGN PATENT DOCUMENTS

JP 2010161158 A 7/2010

OTHER PUBLICATIONS

Office Action dated Mar. 17, 2022 issued in corresponding U.S. Appl. No. 17/104,124.
(Continued)

*Primary Examiner* — Marcos D. Pizarro
*Assistant Examiner* — William Henry Anderson
(74) *Attorney, Agent, or Firm* — Harness, Dickey & Pierce, P.L.C.

(57) ABSTRACT

A semiconductor device includes bumps and a plurality of input/output areas on a substrate. Each of the input/output areas include semiconductor elements on the substrate, lower wiring patterns connected to the semiconductor elements, and input/output pins above and connected to the lower wiring patterns. The semiconductor elements provide a logic circuit and a protection circuit. The bumps are above the lower wiring patterns and connected to the input/output pins by upper wiring patterns. The input/output areas include a first input/output area and a second input/output area. The input/output areas includes a first circuit area including the electrostatic discharge protection circuit and a second circuit area including the logic circuit. In the first input/output area, the input/output pin is in the first circuit area. In the second input/output area, the input/output pin is in the second circuit area.

20 Claims, 33 Drawing Sheets

(51) Int. Cl.
*H01L 23/00* (2006.01)
*H01L 23/522* (2006.01)
*H01L 27/02* (2006.01)

(52) U.S. Cl.
CPC .......... *H01L 24/14* (2013.01); *H01L 27/0296* (2013.01); *H01L 2224/14135* (2013.01)

(56) References Cited

U.S. PATENT DOCUMENTS

| | | | |
|---|---|---|---|
| 6,225,143 B1 | 5/2001 | Rao et al. | |
| 6,674,166 B2 | 1/2004 | Rao et al. | |
| 7,034,391 B2 | 4/2006 | Pendse | |
| 7,080,341 B2 * | 7/2006 | Eisenstadt | H03K 19/17744 716/120 |
| 7,117,469 B1 | 10/2006 | Dahl | |
| 7,872,283 B2 * | 1/2011 | Matsuoka | H01L 23/5286 257/691 |
| 8,581,302 B2 | 11/2013 | Kinoshita et al. | |
| 8,698,325 B2 | 4/2014 | Chang et al. | |
| 9,577,640 B1 * | 2/2017 | Park | H03K 19/1732 |
| 2004/0056355 A1 | 3/2004 | Minami et al. | |
| 2005/0162880 A1 | 7/2005 | Miyaki et al. | |
| 2007/0222082 A1 | 9/2007 | Sonohara et al. | |
| 2007/0267748 A1 | 11/2007 | Tran et al. | |
| 2009/0212425 A1 | 8/2009 | Ito et al. | |
| 2010/0027171 A1 | 2/2010 | Jalilizeinali et al. | |
| 2011/0260318 A1 * | 10/2011 | Eisenstadt | H01L 24/14 257/E23.06 |
| 2014/0246701 A1 | 9/2014 | Parks et al. | |
| 2017/0077022 A1 | 3/2017 | Scanlan et al. | |
| 2018/0075181 A1 | 3/2018 | Chang et al. | |
| 2019/0181111 A1 | 6/2019 | Kim et al. | |
| 2019/0363060 A1 * | 11/2019 | Ho | H01L 23/5222 |

OTHER PUBLICATIONS

Office Action dated Jun. 30, 2022 issued in corresponding U.S. Appl. No. 17/104,124.
Office Action dated Feb. 23, 2023 issued in related U.S. Appl. No. 17/104,124.

* cited by examiner

SEMICONDUCTOR DEVICE INCLUDING AN INPUT/OUTPUT CIRCUIT

CROSS-REFERENCE TO RELATED APPLICATION(S)

This application claims the benefit under 35 USC 119(a) of Korean Patent Application No. 10-2020-0086507 filed on Jul. 14, 2020 in the Korean Intellectual Property Office, the entire disclosure of which is incorporated herein by reference for all purposes.

BACKGROUND

1. Field

Inventive concepts relate to a semiconductor device.

2. Description of Related Art

Semiconductor devices mounted on electronic devices may include bumps connected to package substrates and the like to input and output power and signals. Such bumps may be electrically connected to circuits inside the semiconductor devices through input/output areas included in the semiconductor devices. To increase the degree of integration of a semiconductor device, it may be necessary to dispose as many bumps as possible in the same area. In addition, to improve electrical characteristics of a semiconductor device, reducing the length of a wiring pattern connecting bumps and input/output areas, as possible, may be required.

SUMMARY

Example embodiments provide a semiconductor device in which integration and electrical characteristics may be improved by disposing relatively more bumps and input/output areas in a limited area to efficiently dispose the bumps and the input/output areas and/or reduce the length of wiring patterns connecting the bumps and the input/output areas.

According to an example embodiment, a semiconductor device includes a substrate; a plurality of input/output areas, and a plurality of bumps. Each of the plurality of input/output areas include semiconductor elements on the substrate and providing a logic circuit and an electrostatic discharge protection circuit, lower wiring patterns connected to the semiconductor elements, input/output pins above the lower wiring patterns and connected to the lower wiring patterns, and upper wiring patterns. The plurality of bumps are above the lower wiring patterns and connected to the input/output pins by the upper wiring patterns. The plurality of input/output areas include a first input/output area and a second input/output area. Each of the plurality of input/output areas includes a first circuit area including the electrostatic discharge protection circuit and a second circuit area including the logic circuit. The input/output pins of the first input/output area may be in the first circuit area of the first input/output area. The input/output pins of the second input/output area may be in the second circuit area of the second input/output area.

According to an example embodiment, a semiconductor device includes a substrate having a first area and a second area surrounded by the first area; a plurality of input/output areas in the first area; a core region in the second area; and a plurality of bumps. The plurality of input/output areas may be arranged in a first direction parallel to an upper surface of the substrate and in a second direction different from the first direction. Each of the plurality of input/output areas may include semiconductor elements providing an input/output circuit, lower wiring patterns connected to the semiconductor elements, an input/output pin connected to the lower wiring patterns, and upper wiring patterns. The plurality of bumps may be connected to the input/output pins by the upper wiring patterns at the same height as the input/output pins. The lower wiring patterns may provide an input/output wiring pattern connecting the input/output circuit to the core region. The plurality of input/output areas may include a first input/output area and a second input/output area. A distance between the input/output wiring pattern and the input/output pin in the first input/output area may be a first distance. A distance between the input/output wiring pattern and the input/output pin in the second input/output area may be a second distance. The second distance may be different from the first distance.

According to an example embodiment, a semiconductor device includes a substrate; a plurality of input/output areas in a first area of the substrate; a core region connected to the plurality of input/output areas, the core region being configured to receive an input signal from the plurality of input/output areas or to transmit an output signal to the plurality of input/output areas; and a plurality of bumps electrically connected to the input/output areas. Each of the plurality of input/output areas may include a logic circuit area and a protection circuit area. The logic circuit area may include an input/output wiring pattern connected to the core region. The protection circuit area may be connected to at least one of the plurality of bumps. In at least one of the plurality of input/output areas, at least one of wiring patterns connecting at least one of the plurality of bumps and the protection circuit area may traverse a boundary between the logic circuit area and the protection circuit area.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, example embodiments will be described with reference to the accompanying drawings.

Figure 1:
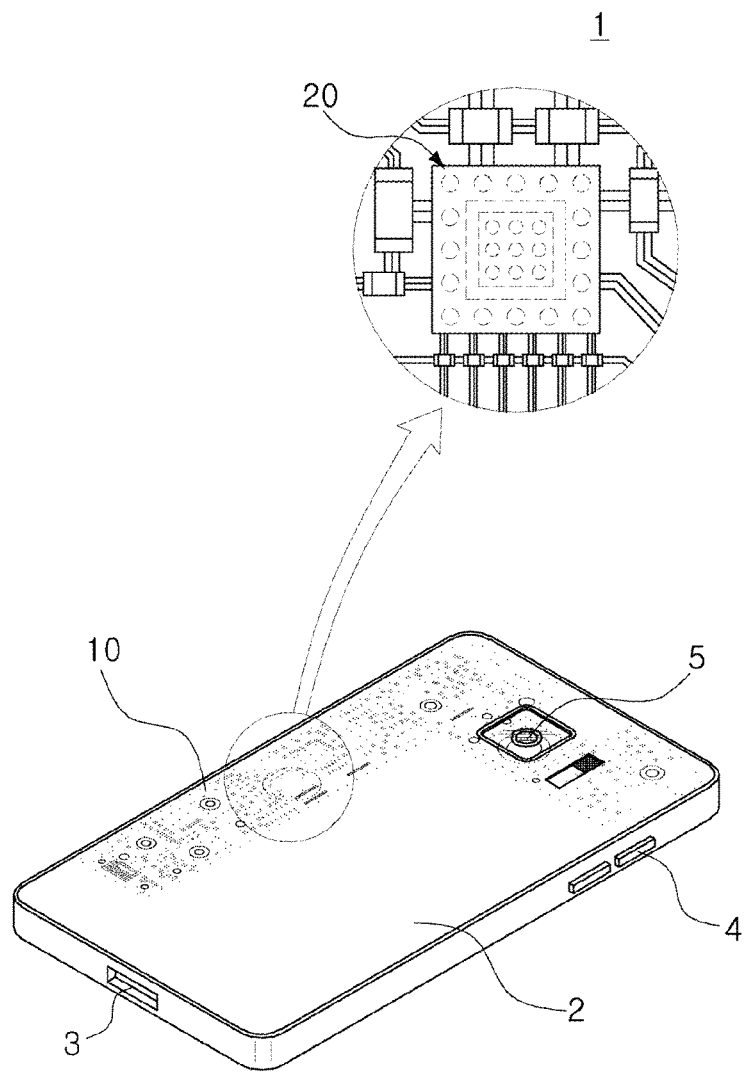
FIG. 1 is a simplified diagram illustrating an electronic device including a semiconductor device according to an example embodiment.

FIG. 1 is a simplified diagram illustrating an electronic device including a semiconductor device according to an example embodiment.

Referring to FIG. 1, an electronic device 1 according to an example embodiment may be a mobile device. However, the electronic device 1 to which the semiconductor device according to the example embodiment may be applied is not limited to a mobile device. The semiconductor device according to an example embodiment may be applied to various electronic devices other than a mobile device.

Referring to FIG. 1, the electronic device 1 according to an example embodiment may include a case 2, a port 3 provided for connection between the electronic device 1 and an external device, an input unit 4 (e.g., button), a camera 5 and the like. According to example embodiments, the camera 5 may be disposed on a front surface of the electronic device 1 and may include a plurality of cameras. The plurality of cameras may have different angles of view, numbers of pixels, and aperture values, and a user may capture various images using the plurality of cameras. For example, at least one of the plurality of cameras may be a ToF camera for measuring a distance to an object or detecting a shape of an object.

Various components may be mounted inside the case 2 of the electronic device 1 as illustrated in FIG. 1. Components are components for implementing various functions of the electronic device 1 and may include a semiconductor device, a circuit board, a battery, and circuit elements. For example, a circuit board 10 is mounted inside the case 2 of the electronic device 1, and a semiconductor device 20 may be mounted on the circuit board 10. The semiconductor device 20 may exchange data and/or power with other semiconductor devices, circuit elements, and batteries through the circuit board 10.

The semiconductor device 20 may be connected to circuit patterns formed on the circuit board 10 in a mounting area defined on the circuit board 10. The semiconductor device 20 includes bumps connected to circuit patterns in a mounting area, and the bumps may be exposed to the outside of the semiconductor device 20. The bumps may be electrically connected to circuits inside the semiconductor device 20 by wiring patterns included in the semiconductor device 20.

In an example embodiment, the bumps may be connected to input/output areas inside the semiconductor device 20 by wiring patterns. The input/output areas may process signals transmitted through bumps and transmit the signals to a core region inside the semiconductor device 20, or may output a signal generated and output by the core region to the outside of the semiconductor device 20. In an example embodiment, the lengths of wiring patterns may be shortened by efficiently disposing bumps and input/output areas, and the degree of integration and electrical characteristics of the semiconductor device 20 may be improved.

Figure 2:
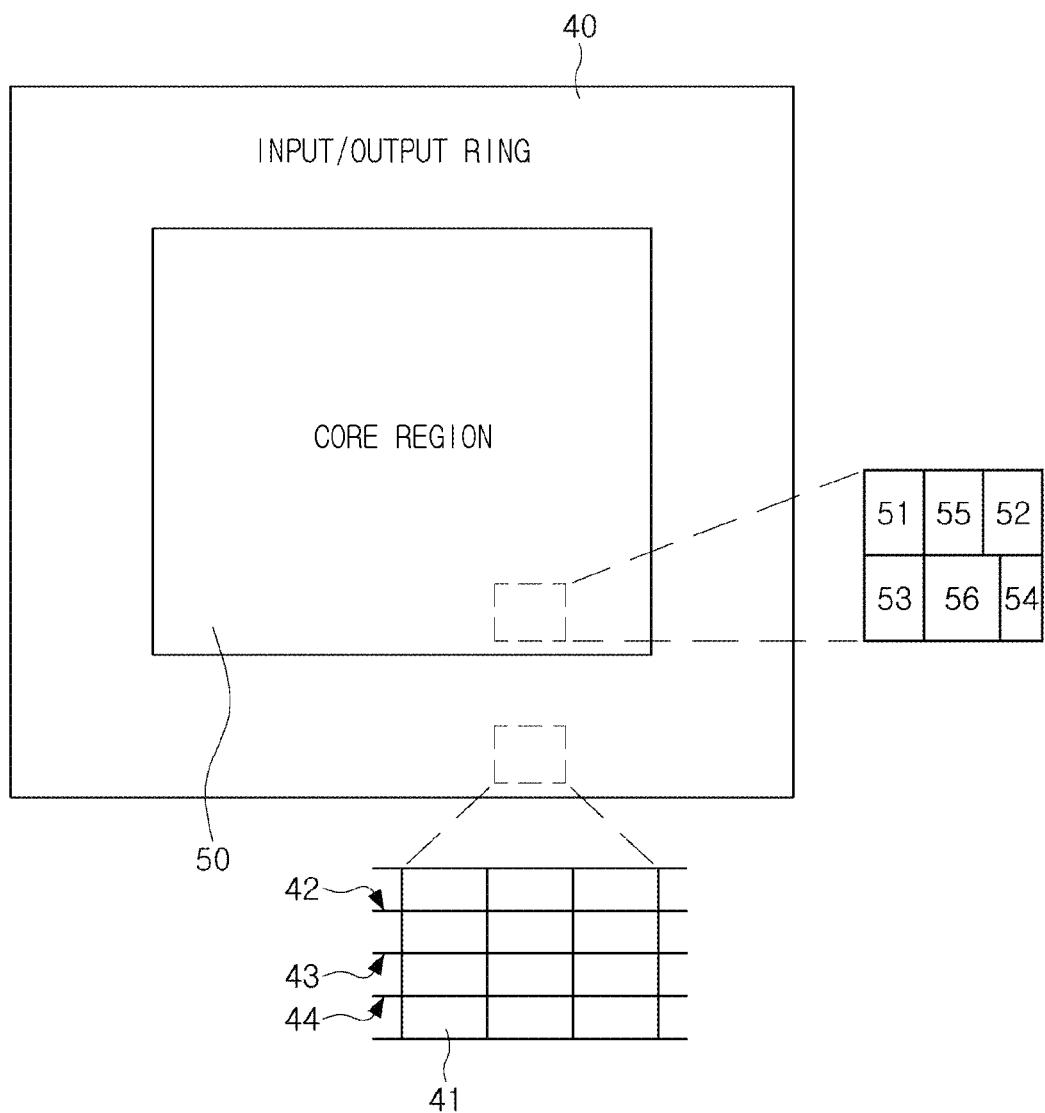
FIGS. 2 and 3 are schematic diagrams illustrating a semiconductor device according to an example embodiment.
Figure 3:
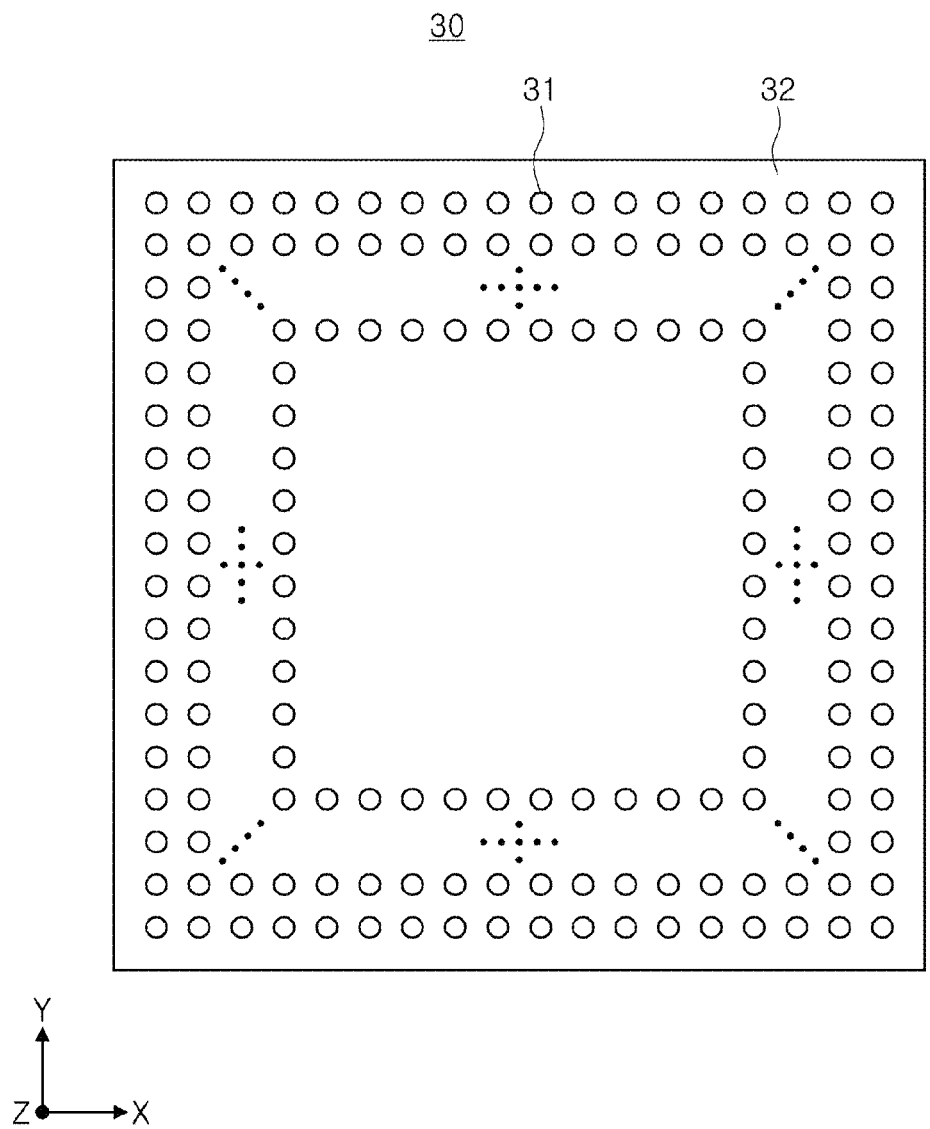

FIGS. 2 and 3 are schematic diagrams illustrating a semiconductor device according to an example embodiment.

First, referring to FIG. 2, a semiconductor device 30 according to an example embodiment may include an input/output ring 40 and a core region 50. The input/output ring 40 may include a plurality of input/output areas 41, and the input/output areas 41 may be disposed in a first direction, parallel to one surface of the semiconductor device 30 and in a second direction, intersecting the first direction. For example, one of the first and second directions may be a width direction and the other may be a longitudinal direction. The input/output ring 40 may include a plurality of wirings 42 to 44 extending while traversing the input/output areas 41. Power and signals may be transmitted through the wirings 42 to 44. The input/output areas 41 may be separated from the core region 50 to have a desired and/or alternatively predetermined distance.

In an example embodiment, each of the input/output areas 41 may include semiconductor elements providing input/output circuits and lower wiring patterns connected to the semiconductor elements. The lower wiring patterns may connect semiconductor elements to provide an input/output circuit, and input/output pins may be connected to the upper portions of the lower wiring patterns. The input/output pin is connected to a redistribution layer that is disposed to be higher than the lower wiring patterns, and for example, the input/output pin and the redistribution layer may be disposed at the same height. The input/output circuit may include a logic circuit processing input/output signals and power signals, and an electrostatic discharge protection circuit protecting the semiconductor device 30 from electrostatic discharge introduced externally.

The core region 50 may include a plurality of circuit blocks. At least one of the circuit blocks may include standard cells 51-54 disposed in the first and second directions, filler cells 55 and 56 disposed between the standard cells 51-54, and the like. Each of the standard cells 51 to 54 may include semiconductor elements for implementing a circuit providing a desired and/or alternatively predetermined function and wiring patterns connected to the semiconductor elements. In an example embodiment, among the wiring patterns, only some wiring patterns disposed close to semiconductor elements may be defined in the respective standard cells 51 to 54.

The filler cells 55 and 56 are cells filling between the standard cells 51 to 54 and may include semiconductor elements. For example, the semiconductor elements included in the filler cells 55 and 56 may be dummy devices that do not participate in the actual operation of the core region 50.

Next, referring to FIG. 3, a plurality of bumps 31 may be formed on one surface of the semiconductor device 30. The bumps 31 may protrude outside the protective layer 32 for protecting semiconductor elements and wiring patterns inside the semiconductor device 30, and may be electrically connected to circuit patterns of a substrate mounted on an electronic device. In addition, the bumps 31 are formed on at least a portion of one surface of the semiconductor device 30 and may be electrically connected to the input/output areas 41 disposed in the input/output ring 40.

On the other hand, unlike the example embodiment illustrated in FIG. 3, bumps 31 may be formed on a substantially entire surface of the semiconductor device 30. In addition, some of the bumps 31 may be dummy bumps to which an actual signal or power is not input/output. For example, by forming the bumps 31 on the entire surface of the semiconductor device 30 including dummy bumps, stress applied to the semiconductor device 30 may be dispersed.

In an example embodiment, the bumps 31 may be connected to the input/output areas 41 by upper wiring patterns disposed at the same height as the bumps 31. The upper wiring patterns may be redistribution layers, and each of the upper wiring patterns may directly contact the input/output pin and the bump 31 of the input/output areas 41 in one layer. The upper wiring patterns may extend in directions parallel to one surface of the semiconductor device 30, and when the lengths of the upper wiring patterns increase, electrical characteristics such as IR drops may be deteriorated in the input/output areas 41.

An example embodiment of inventive concepts proposes a method of significantly reducing the distance between the input/output areas 41 and the bumps 31 to limit and/or prevent deterioration of electrical characteristics occurring in the input/output areas 41. In addition, by disposing as many bumps 31 as possible in a limited area, the physical size of the semiconductor device 30 may be reduced and the degree of integration may be improved.

Figure 4A:
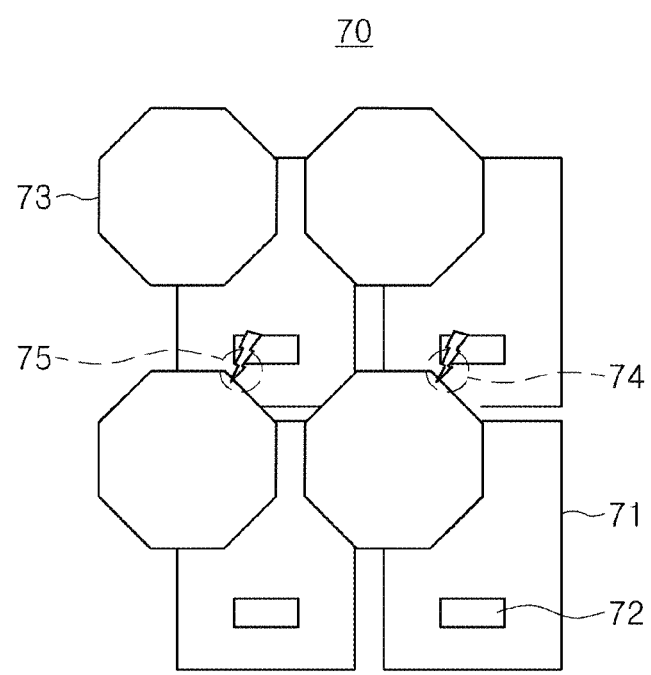
FIGS. 4A and 4B are diagrams illustrating comparative examples to illustrate a semiconductor device according to an example embodiment.
Figure 4B:
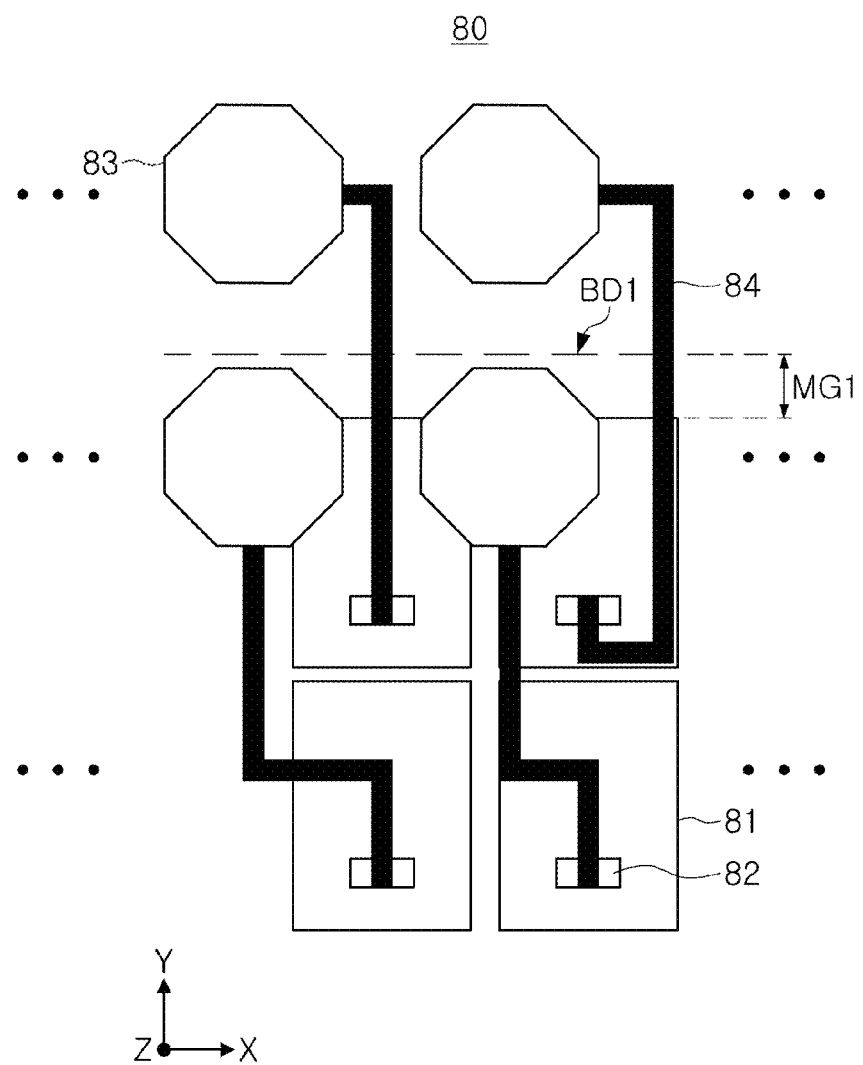

FIGS. 4A and 4B are diagrams illustrating comparative examples to illustrate a semiconductor device according to an example embodiment.

First, referring to a comparative example of FIG. 4A, input/output areas 71 in the semiconductor device 70 may be disposed in one form. Referring to FIG. 4A, input/output pins 72 connected to upper wiring patterns in input/output areas 71 are disposed at the same position in all input/output areas 71. Therefore, as illustrated in FIG. 4A, when some of the bumps 73 are disposed between the input/output areas 71, a defect 74, 75 due to interference between the bumps 73 and the input/output pins 72 may occur.

To limit and/or prevent defects 74 and 75 from occurring between the bumps 73 and the input/output pins 72, generally, bumps 83 may be disposed as illustrated in FIG. 4B. In a comparative example of FIG. 4B, input/output areas 81 may be separated by a first margin MG1 from the first boundary BD1 between the core region and the input/output ring. Referring to the comparative example of FIG. 4B, the input/output areas 81 are disposed in a shape as illustrated in FIG. 4A. The bumps 83 are disposed to be separated from the input/output pins 82 of the input/output areas 81 as possible, and the bumps 83 and the input/output pins 82 may be connected to each other by upper wiring patterns 84. As a result, as illustrated in FIG. 4B, the length of the upper wiring patterns 84 inevitably increases, which may cause IR drops and the like, leading to deterioration of electrical characteristics in the input/output areas 81. In addition, as the area required to form the bumps 83 increases, the degree of integration of the semiconductor device 80 may decrease.

Figure 5A:
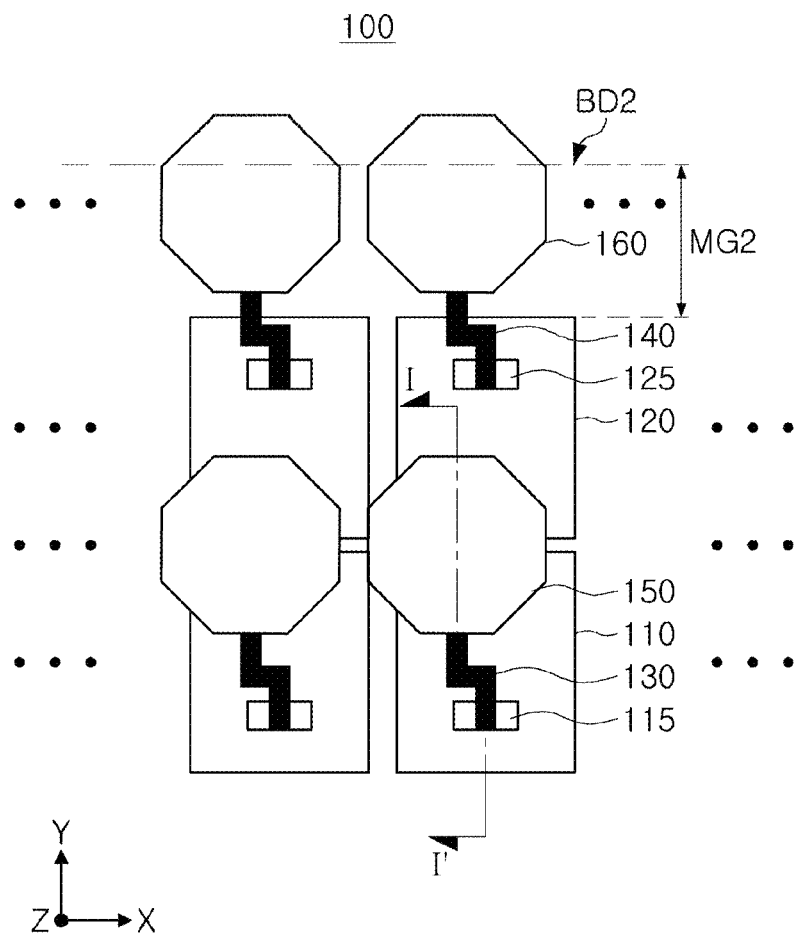
FIGS. 5A and 5B are diagrams illustrating a semiconductor device according to an example embodiment.
Figure 5B:
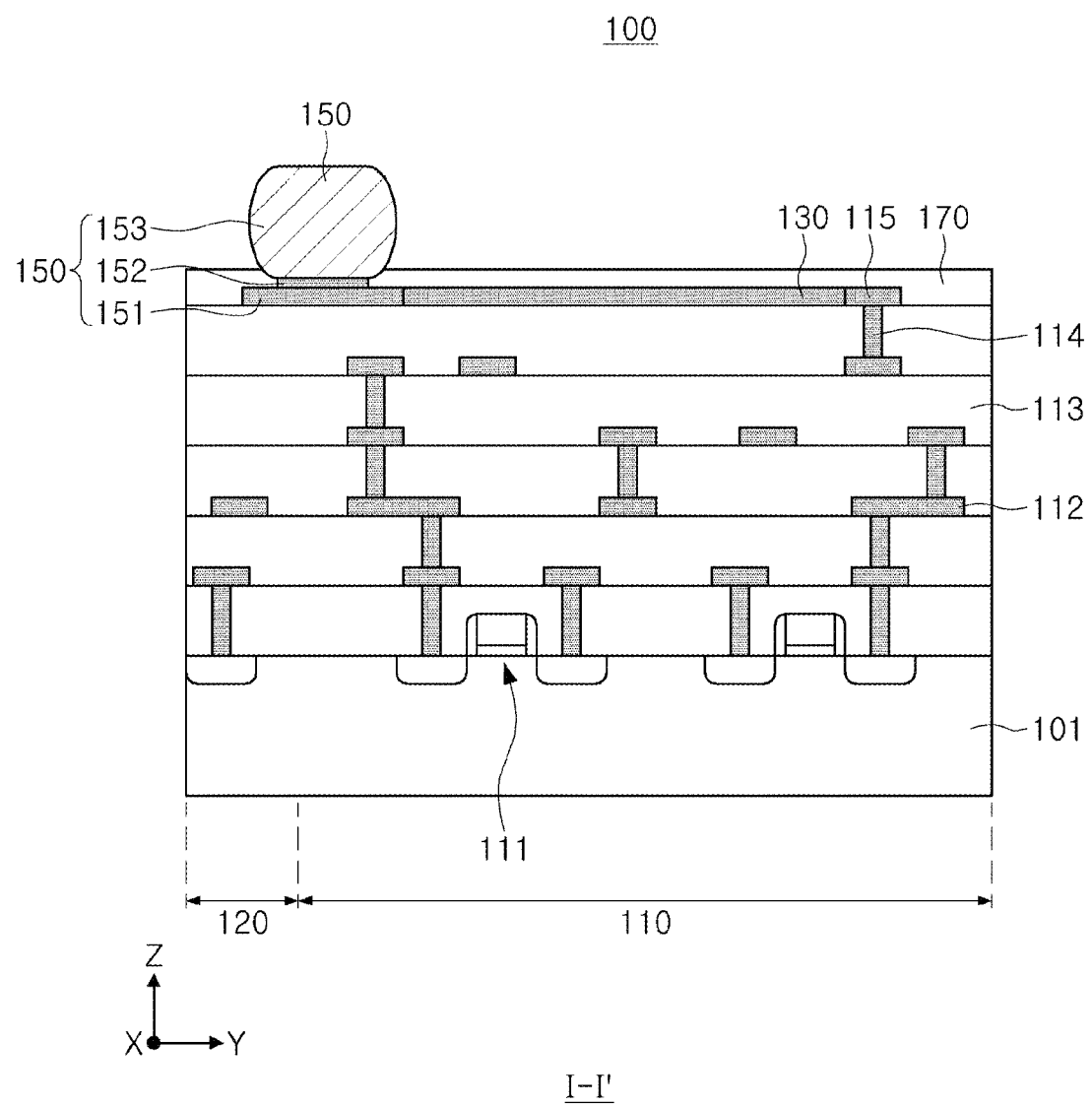

FIGS. 5A and 5B are diagrams illustrating a semiconductor device according to an example embodiment of inventive concepts.

Referring to FIG. 5A, a semiconductor device 100 according to an example embodiment may include input/output areas 110 and 120 and bumps 160. The input/output areas 110 and 120 and bumps 150 and 160 are connected to each other by upper wiring patterns 130 and 140, and the input/output areas 110 and 120 may include input/output pins 115 and 125 in direct contact with the upper wiring patterns 130 and 140. The upper wiring patterns 130 and 140 may be redistribution layers disposed at the same height as the bumps 150 and 160 and the input/output pins 115 and 125. For example, the upper wiring patterns 130 and 140 are disposed in the first layer together with the input/output pins 115 and 125, and each of the upper wiring patterns 130 and 140 may include a conductive line continuously connected to the respective input/output pins 115 and 125.

Referring to FIG. 5A, the input/output areas 110 and 120 may have a rectangular shape, and the bumps 150 and 160 may have an octagonal shape, which is merely an example, and the shape and size of the input/output areas 110 and 120 and the bumps 150 and 160 may be variously modified. As an example, in FIG. 5A, the width of each of the bumps 150 and 160 is illustrated to be less than the width of each of the input/output areas 110 and 120, and in a different manner, the width of each of the bumps 150 and 160 may be greater than the width of each of the input/output areas 110 and 120.

The input/output areas 110 and 120 may be disposed in a first direction (a Y-axis direction) and a second direction (an X-axis direction). The input/output areas 110 and 120 adjacent in the first direction may be defined as a first input/output area 110 and a second input/output area 120. For example, the first input/output area 110 and the second input/output area 120 may be disposed in order in the first direction.

Referring to FIG. 5A, in the first input/output area 110 and the second input/output area 120, input/output pins 115 and 125 may be disposed in different positions. For example, a location in which the input/output pin 115 is disposed in the first input/output area 110 and a location in which the input/output pin 125 is disposed in the second input/output area 120 may be different from each other. Referring to FIG. 5A, in the first input/output area 110, the input/output pin 115 is disposed in a lower portion in the first direction, and in the second input/output area 120, the input/output pin 125 may be disposed in an upper portion in the first direction.

Accordingly, a sufficient area in which the bumps 150 may be disposed on the first input/output area 110 and the second input/output area 120 adjacent to each other in the first direction may be secured. In the example embodiment illustrated in FIG. 5A, a first bump 150 connected to the first input/output area 110 is disposed to overlap both the first input/output area 110 and the second input/output area 120. The length of the first upper wiring pattern 130 connecting the first bump 150 and the first input/output pin 115 may be reduced, and the electrical characteristics of the signal transmission path provided by the first input/output area 110 and the first bump 150 may be improved. For example, the first upper wiring pattern 130 may be formed to have a length that does not extend to an upper portion of the second input/output area 120.

Similarly, the length of the second upper wiring pattern 140 may also be shortened, and electrical characteristics of the signal transmission path provided by the second input/output area 120 and the second bump 160 may be improved. In addition, by disposing at least a portion of the bumps 150 and 160 between the input/output pins 115 and 125 in the first direction, the area of a region in which the bumps 150 and 160 are disposed may be reduced. Alternatively, the number of bumps 150 and 160 disposed in the same area may be increased. Accordingly, the degree of integration of the semiconductor device 100 may be improved together with the electrical characteristics of the semiconductor device 100.

On the other hand, in the example embodiment illustrated in FIG. 5A, the second input/output area 120 adjacent to the core region may be separated by a second margin MG2 from the second boundary BD2 between the core region and the input/output ring. Since the second input/output pin 125 of the second input/output area 120 is disposed close to the core region, the second margin MG2 may be greater than the first margin MG1 of the comparative example described with reference to FIG. 4B. For example, the second margin MG2 may be equal to or more than twice the first margin MG1.

In addition, the first bump 150 may be separated from the first input/output pin 115 by a desired and/or alternatively predetermined distance. For example, a desired and/or alternatively predetermined distance may need to be secured between the bumps 150 and 160 and the guard region disposed along the outer periphery of the semiconductor device 100. Accordingly, to secure a distance between the first bump 150 and the guard area, the first bump 150 and the first input/output pin 115 may be separated from each other by a desired and/or alternatively predetermined distance.

As illustrated in FIG. 5A, the second input/output area 120 may have a different structure from the first input/output area 110 to secure a space between the input/output pins 115 and 125. In an example embodiment, the order in which the logic circuit and the electrostatic discharge protection circuit are disposed in the first input/output area 110 may be different from the order in which the logic circuit and the electrostatic discharge protection circuit are disposed in the second input/output area 120. As an example, in the first input/output area 110, in the first direction, a logic circuit may be disposed above the electrostatic discharge protection circuit, and in the second input/output area 120, an electrostatic discharge protection circuit may be disposed above the logic circuit. In this case, the input/output pins 115 and 125 may be disposed above the electrostatic logic circuit in the third direction (a Z-axis direction) in the first input/output area 110 and the second input/output area 120, respectively.

In addition, in an example embodiment, the orders in which the logic circuit and the electrostatic discharge protection circuit may be disposed are the same in the respective first input/output area 110 and second input/output area 120, and only the positions of the input/output pins 115 and 125 may only be changed. In this case, in each of the first input/output area 110 and the second input/output area 120 in the first direction, the logic circuit may be disposed on the electrostatic discharge protection circuit, or the electrostatic discharge protection circuit may be disposed on the logic circuit. In addition, in the first input/output area 110 in the third direction, the first input/output pin 115 may be disposed on an upper portion of the electrostatic discharge protection circuit, and in the second input/output area 120, the second input/output pin 125 may be disposed on the logic circuit. Accordingly, structures of wiring patterns connecting the respective input/output pins 115 and 125 to the electrostatic discharge protection circuit may be different from each other in the first input/output area 110 and the second input/output area 120.

FIG. 5B is a cross-sectional view illustrating a cross-section in the direction I-I' of FIG. 5A. Referring to FIG. 5B, the semiconductor device 100 includes a first input/output area 110 and a second input/output area 120 disposed adjacent to each other in a first direction, and the first input/output area 110 and the second input/output area 120 may have similar structures.

The first input/output area 110 may include semiconductor elements 111 formed on a substrate 101. For example, the semiconductor elements 111 may be transistors, and may include transistors of various structures such as FINFET and MBCFET. The semiconductor elements 111 may be connected to lower wiring patterns 112, and the lower wiring patterns 112 may be covered with an interlayer insulating layer 113. The lower wiring patterns 112 may be connected to the first input/output pin 115 through an upper contact 114.

The first input/output pin 115 may be connected to the upper wiring pattern 130. The upper wiring pattern 130 may be a redistribution layer. The lower wiring patterns 112 may be defined as wiring patterns disposed below the first input/output pin 115 and the upper contact 114. On the other hand, the upper wiring pattern 130 may be disposed on the same layer as the first input/output pin 115, and may be a wiring pattern continuously extending from the first input/output pin 115. For example, the upper wiring pattern 130 may be a wiring pattern disposed on an uppermost layer of the semiconductor device 100 in the third direction (the Z-axis direction). In an example embodiment, the upper wiring pattern 130 and the first input/output pin 115 may have different widths or may have the same width.

The first upper wiring pattern 130 may directly contact the first input/output pin 115 and the first bump 150, and may be covered with a protective layer 170. For example, the first bump 150 includes a lower bump pattern 151 disposed at the same height as the upper wiring pattern 130 and the first input/output pin 115, and an upper bump pattern 152 on the lower bump pattern 151, and a solder bump 153 in contact with the upper bump pattern 152. In the protective layer 170, the lower bump pattern 151 and the first upper wiring pattern 130 contact each other, and a portion of the solder bump 153 may be exposed to the outside of the protective layer 170. For example, the protective layer 170 may be formed on an outermost side of the semiconductor device 100 to protect the semiconductor device 100. In an example embodiment, the upper bump pattern 152 may have an area smaller than an area of at least one of the lower bump pattern 151 and the solder bump 153 on the upper surface (an X-Y plane) of the substrate 101.

The semiconductor elements 111 may provide a logic circuit for processing power and/or signals transmitted through a first bump 150 and transmitting the power and the signals to circuit blocks inside the semiconductor device 100, an electrostatic discharge protection circuit for protecting the semiconductor device 100 from electrostatic discharge that may be introduced through the first bump 150, and the like. As an example, the electrostatic discharge protection circuit is connected between the first bump 150 and the logic circuit, and the power voltage and signal voltage transmitted through the first bump 150 are all passed through the electrostatic discharge protection circuit to be input to the logic circuit, which will be described with reference to FIG. 6, below.

Figure 6:
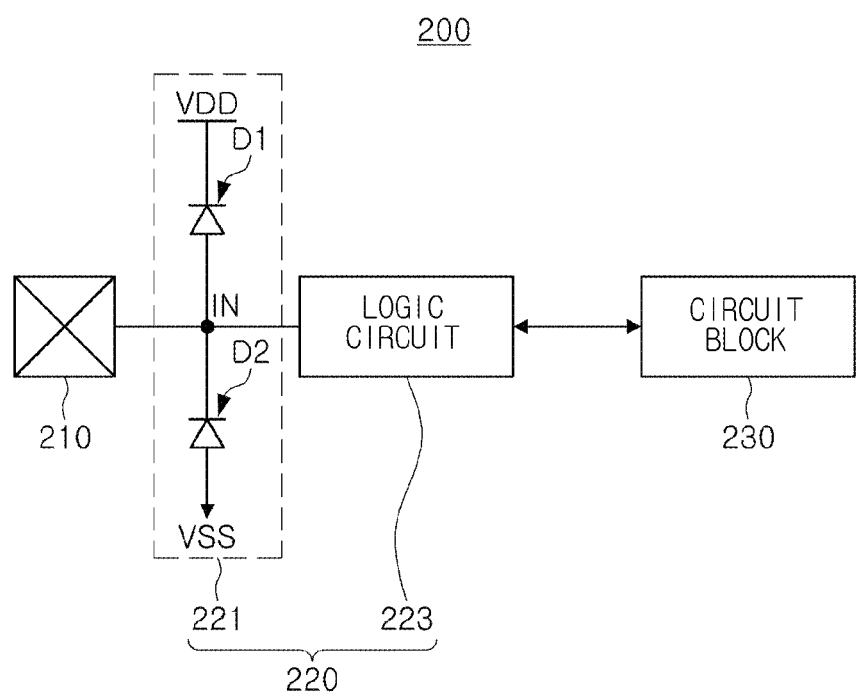
FIG. 6 is a block diagram illustrating an input/output area of a semiconductor device according to an example embodiment.

FIG. 6 is a block diagram illustrating an input/output area of a semiconductor device according to an example embodiment.

Referring to FIG. 6, a semiconductor device 200 according to an example embodiment may include a bump 210, an input/output area 220, a circuit block 230, and the like. The bump 210 may be a structure exposed to the outside of the semiconductor device 200 and connected to a circuit board outside the semiconductor device 200. The circuit block 230 is mounted inside the semiconductor device 200 and may be a functional block that includes processing circuitry for performing operations, signal processing, and the like required to provide various functions provided by the semiconductor device 200.

The input/output area 220 may transmit a signal input/output between the bump 210 and the circuit block 230. As an example, the power voltage transmitted through the bump 210 may be input to the circuit block 230 through the input/output area 220. In addition, a signal transmitted through the bump 210 is input to the circuit block 230 through the input/output area 220, or a signal output from the circuit block 230 may be transmitted to the bump 210 through the input/output area 220.

The input/output area 220 may include an electrostatic discharge protection circuit 221 and a logic circuit 223. The electrostatic discharge protection circuit 221 may be connected to the bump 210 side, and the logic circuit 223 may be connected to the circuit block 230 side. For example, the electrostatic discharge protection circuit 221 is connected between the bump 210 and the logic circuit 223, and thus, all signals transmitted through the bump 210 pass through the electrostatic discharge protection circuit 221 and then the logic circuit 223 and the circuit block 230.

In an example embodiment, the electrostatic discharge protection circuit 221 may include a first diode D1 and a second diode D2. The first diode D1 may be connected between the first power voltage VDD and the input node IN, and the second diode D2 may be connected between the second power voltage VSS and the input node IN.

When an input voltage is input to the bump 210, the voltage of the input node IN may change to a value corresponding to the input voltage. In general, the input voltage may be greater than the first power voltage VSS and less than the second power voltage VDD. Therefore, since both the first diode D1 and the second diode D2 are biased in the reverse direction, current does not flow through the diodes D1 and D2, and the voltage of the input node IN is transmitted to the logic circuit 223 as it is.

Next, a case in which an abnormal voltage is input to the bump 210 will be described. For example, when an abnormal voltage greater than the second power voltage VDD is input to the bump 210 due to surge or static electricity, the voltage of the input node IN may increase significantly. Therefore, the first diode D1 is forward biased, and a current may flow through the first diode D1. Also, as the voltage of the input node IN increases, a breakdown may occur in the second diode D2, and a reverse current may flow through the second diode D2. As a result, when an abnormal voltage due to surge or electrostatic discharge is input to the bump 210, the electrostatic discharge protection circuit 221 may protect the logic circuit 223 and the circuit block 230 by removing the overcurrent due to the abnormal voltage.

The configuration of the electrostatic discharge protection circuit 221 may be variously modified. For example, at least one of the first diode D1 and the second diode D2 may be replaced with a transistor. When both the first diode D1 and the second diode D2 are replaced with transistors, the first diode D1 may be replaced with a P-type transistor and the second diode D2 may be replaced with an N-type transistor.

Since the electrostatic discharge protection circuit 221 is connected between the bump 210 and the logic circuit 223, the design of the wiring patterns may be simplified by disposing the electrostatic discharge protection circuit 221 below the input/output pin. In an example embodiment, to efficiently dispose the bump 210 and the input/output area 220, the logic circuit 223, not the electrostatic discharge protection circuit 221, may also be located below the input/output pin.

Figure 7:
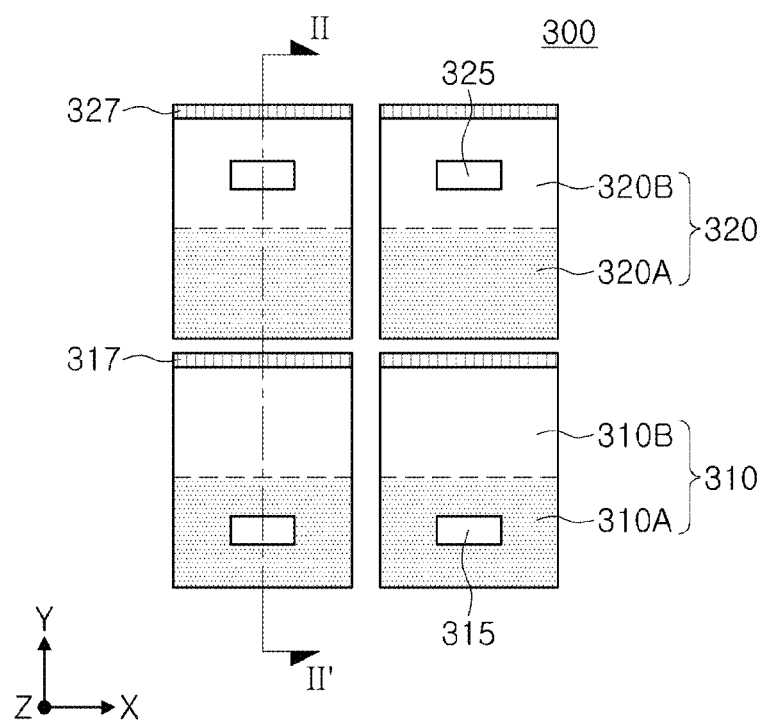
FIGS. 7 and 8 are views illustrating a semiconductor device according to an example embodiment.
Figure 8:
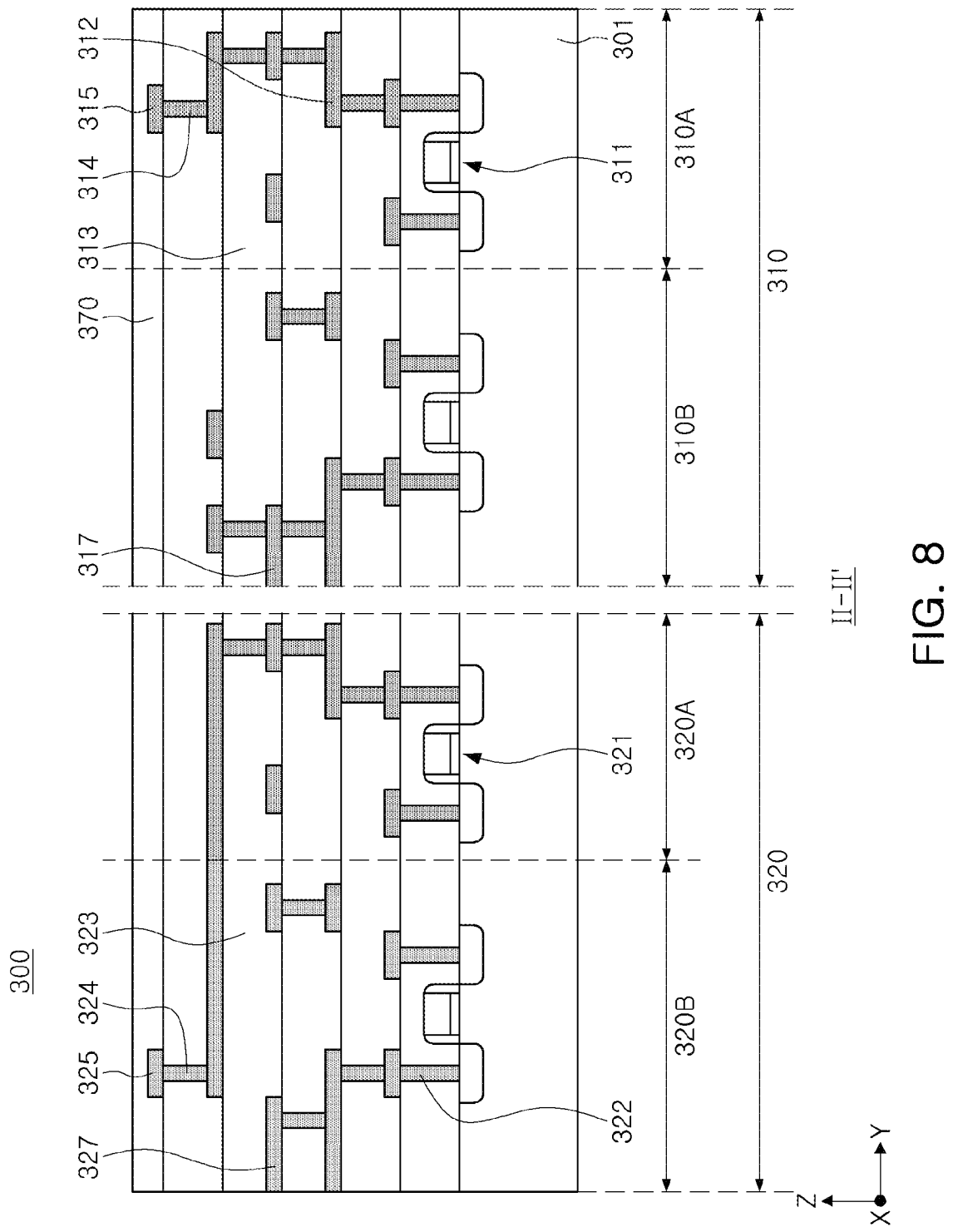

FIGS. 7 and 8 are views illustrating a semiconductor device according to an example embodiment.

FIGS. 7 and 8 may be views illustrating a partial region of an input/output ring in a semiconductor device 300 according to an example embodiment. First, referring to FIG. 7, the semiconductor device 300 may include input/output areas 310 and 320 arranged in a first direction (a Y-axis direction) and a second direction (an X-axis direction). The first direction and the second direction may be parallel to the upper surface of a semiconductor substrate included in the semiconductor device 300.

The first input/output area 310 and the second input/output area 320 may be adjacent to each other in the first direction. The first input/output area 310 includes a first circuit area 310A and a second circuit area 310B adjacent in a first direction, and the second input/output area 320 may also include a first circuit area 320A and a second circuit area 320B adjacent in the first direction. An electrostatic discharge protection circuit may be disposed in the first circuit areas 310A and 320A, and a logic circuit may be disposed in the second circuit areas 310B and 320B.

Input/output wiring patterns 317 and 327 connecting the input/output areas 310 and 320 to the core region of the semiconductor device 300, respectively, may be disposed in the second circuit areas 310B and 320B. For example, the core region of the semiconductor device 300 may be disposed on the upper portion of the input/output areas 310 and 320 in the first direction. In the input/output areas 310 and 320, a first boundary and a second boundary extending in a second direction and separated from each other may be defined, and the second boundary may be a boundary disposed to be higher than the first boundary in the first direction. Accordingly, the second boundary may be closer to the core region than the first boundary, and the input/output wiring patterns 317 and 327 may be disposed closer to the second boundary than the first boundary. In addition, the distance between the input/output wiring pattern 317 and the first boundary in the first input/output area 310 may be the same as the distance between the input/output wiring pattern 327 and the second boundary in the second input/output area 320.

Referring to FIG. 7, in the first input/output area 310 and the second input/output area 320, the first circuit areas 310A and 320A and the second circuit areas 310B and 320B may be disposed in the same order, respectively. For example, in the first input/output area 310 in the first direction, the first circuit area 310A may be disposed below the second circuit area 310B, and in the second input/output area 320 in the first direction, the first circuit area 320A may also be disposed below the second circuit area 320B. Accordingly, at the boundary between the first input/output area 310 and the second input/output area 320, the second circuit area 310B of the first input/output area 310 and the first circuit area 320A of the second input/output area 320 may be adjacent to each other. In addition, the input/output wiring pattern 317 of the first input/output area 310 may be disposed adjacent to the boundary between the first input/output area 310 and the second input/output area 320.

In the first input/output area 310, a first input/output pin 315 may be disposed in the first circuit area 310A, and in the second input/output area 320, a second input/output pin 325 may be disposed in a second circuit area 320B. Accordingly, lower wiring patterns for connecting the input/output pins 315 and 325 to the electrostatic discharge protection circuit, respectively, may be different from each other in the first input/output area 310 and the second input/output area 320, which will be described with reference to FIG. 8 below.

FIG. 8 may be a cross-sectional view illustrating a cross-section in the direction II-IF of FIG. 7. Referring to FIG. 8, the first input/output pin 315 may be disposed in the first circuit area 310A, and the second input/output pin 325 may be disposed in the second circuit area 320B. The input/output pins 315 and 325 are connected to the lower wiring patterns 312 and 322 through upper contacts 314 and 324, and the input/output pins 315 and 325 may be covered with a protective layer 370. In the first input/output area 310 and the second input/output area 320, semiconductor elements 311 and 321 may provide an input/output circuit together with at least a portion of the lower wiring patterns 312 and 322, respectively. The input/output circuit includes an electrostatic discharge protection circuit and a logic circuit, and the semiconductor elements 311 and 321 and the lower wiring patterns 312 and 322 may be covered with interlayer insulating layers 313 and 323.

For example, in the first input/output area 310, the lower wiring patterns 312 connecting the first input/output pin 315 and the first circuit area 310A may be disposed only in the first circuit area 310A. On the other hand, at least one of the lower wiring patterns 322 connecting the second input/output pin 325 and the first circuit area 320A in the second input/output area 320 may be disposed in both the first circuit area 320A and the second circuit area 320B. As an example, as illustrated in FIG. 8, in the second input/output area 320, at least one of the lower wiring patterns 322 may be formed in the first circuit area 320A to traverse the second circuit area 320B. The first lower wiring pattern traversing the boundary between the first circuit area 320A and the second circuit area 320B may be disposed on an uppermost portion of the lower wiring patterns 322. For example, as illustrated in FIG. 8, the first lower wiring pattern may be directly connected to the first input/output pin 325 and the upper contact 324.

By disposing the input/output pins 315 and 325 as illustrated in FIGS. 7 and 8, sufficient space may be secured between the input/output pins 315 and 325, and the input/output areas 310 and 320 and the bumps may be efficiently disposed. In addition, since the first input/output wiring pattern 317 and the second input/output wiring pattern 327 do not face each other between the first input/output area 310 and the second input/output area 320, the distance between the first input/output area 310 and the second input/output area 320 may be significantly reduced, and an area required for the arrangement of the input/output areas 310 and 320 may be reduced. In an example embodiment, the first input/output wiring pattern 317 and the second input/output wiring pattern 327 may be disposed at the same height from the substrate 301.

Figure 9:
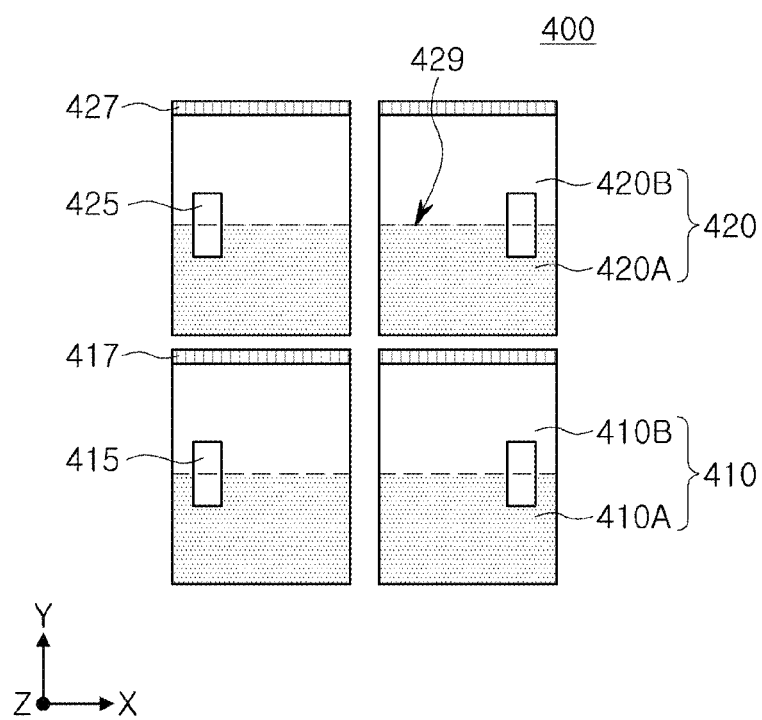
FIGS. 9 and 10 are views illustrating semiconductor devices according to example embodiments.
Figure 10:
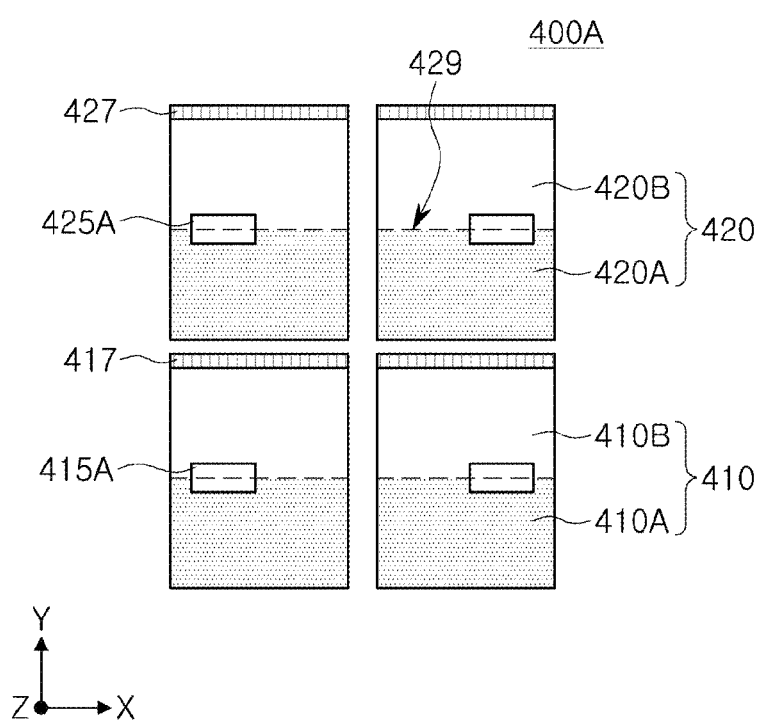

FIGS. 9 and 10 are views illustrating semiconductor devices according to example embodiments.

FIGS. 9 and 10 may be views illustrating partial regions of input/output rings included in semiconductor devices 400 and 400A according to example embodiments. First, referring to FIG. 9, the semiconductor device 400 may include input/output areas 410 and 420 disposed in a first direction (a Y-axis direction) and a second direction (an X-axis direction). For example, the first input/output area 410 and the second input/output area 420 may be adjacent to each other in the first direction. The first input/output area 410 may include a first circuit area 410A and a second circuit area 410B adjacent in the first direction, and the second input/output area 420 may include a first circuit area 420A and a second circuit area 420B adjacent in the first direction.

Referring to FIG. 9, in the input/output areas 410 and 420, input/output pins 415 and 425 may be disposed at the boundary between the first circuit areas 410A and 420A and the second circuit areas 410B and 420B, respectively. Each of the input/output pins 415 and 425 may have a relatively greater width in the first direction. In the input/output areas 410 and 420 adjacent to the first direction and disposed at the same location in the second direction, the input/output pins 415 and 425 may be disposed at the same location in the second direction. In addition, in the input/output areas 410 and 420 adjacent in the second direction and disposed at the same location in the first direction, the input/output pins 415 and 425 may be disposed at different locations in the second direction. For example, in one of the pair of first input/output areas 410 adjacent in the second direction, the input/output pin 415 may be disposed on the left side, and in the other, the input/output pin 415 may be disposed on the right side. Accordingly, a space in which bumps may be arranged between the input/output pins 415 and 425 may be secured, and the input/output areas 410 and 420 and the bumps may be efficiently disposed.

Next, referring to FIG. 10, in the semiconductor device 400A, input/output pins 415A and 425A may be disposed at a boundary between the first circuit areas 410A and 420A and the second circuit areas 410B and 420B. Each of the input/output pins 415A and 425A may have a greater width in the second direction. The arrangement of the input/output pins 415A and 425A in the semiconductor device 400A according to the example embodiment illustrated in FIG. 10 may be similar to that described with reference to FIG. 9.

Figure 11:
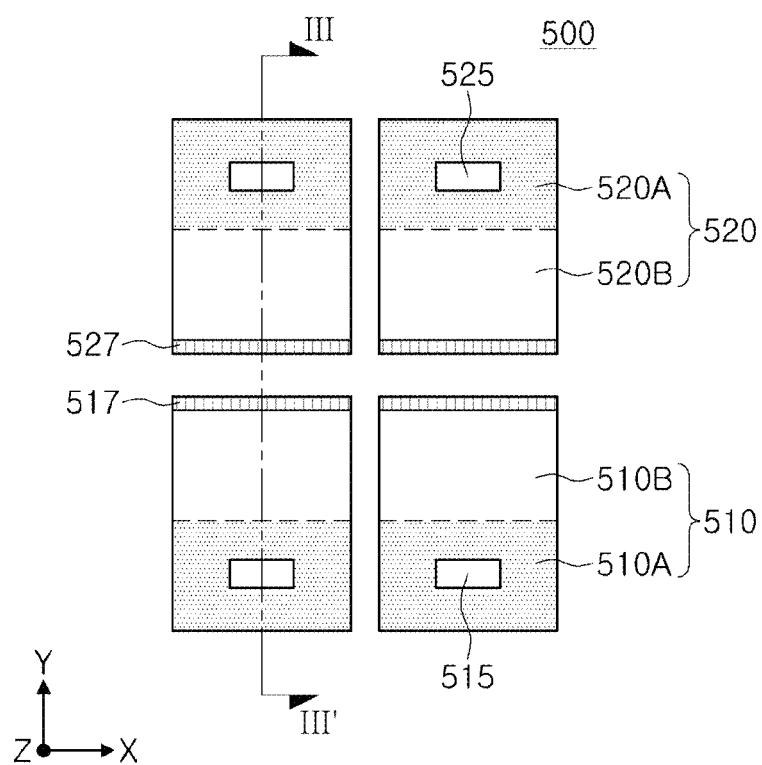
FIGS. 11 and 12 are diagrams illustrating a semiconductor device according to an example embodiment.
Figure 12:
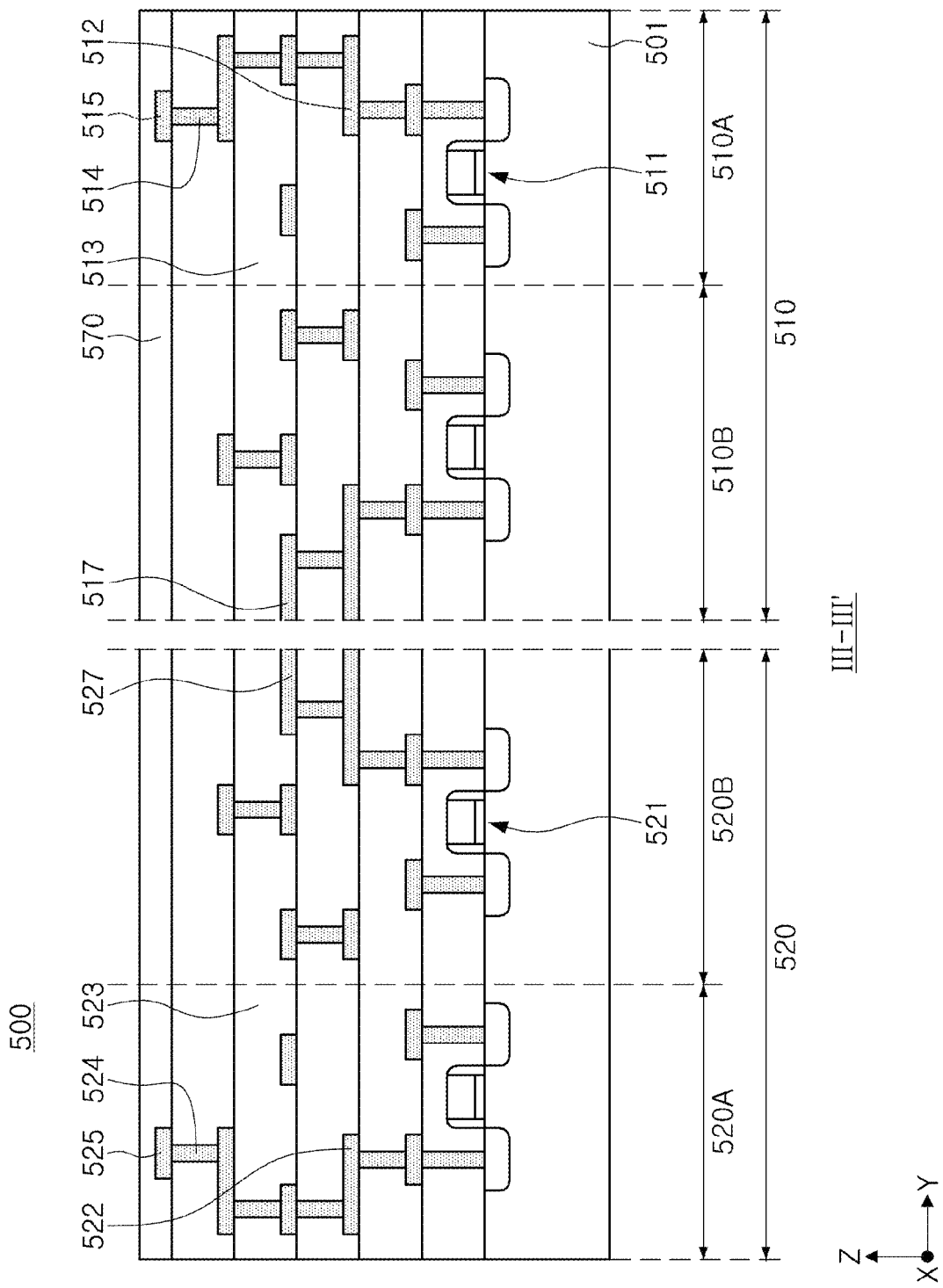

FIGS. 11 and 12 are diagrams illustrating a semiconductor device according to an example embodiment.

First, referring to FIG. 11, a semiconductor device 500 may include input/output areas 510 and 520 disposed in a first direction (a Y-axis direction) and a second direction (an X-axis direction). The input/output areas 510 and 520 may include first circuit areas 510A and 520A and second circuit areas 510B and 520B that are adjacent to each other in the first direction, respectively. An electrostatic discharge protection circuit may be disposed in the first circuit areas 510A and 520A, and a logic circuit may be disposed in the second circuit areas 510B and 520B.

In the example embodiment illustrated in FIG. 11, the order in which the first circuit area 510A and the second circuit area 510B are disposed in the first input/output area 510 and the order in which the first circuit area 520A and the second circuit area 520B are disposed in the second input/output area 520 may be different from each other. For example, in the first input/output area 510, the second circuit area 510B is disposed on an upper portion of the first circuit area 510A in a first direction, and in the second input/output area 520, the second circuit area 520B may be disposed below the first circuit area 520A in the first direction.

Accordingly, in the example embodiment illustrated in FIG. 11, at the boundary between the first input/output area 510 and the second input/output area 520, the second circuit area 510B of the first input/output area 510 and the second circuit area 520B of the second input/output area 520 may be adjacent to each other. Also, at a boundary between the first input/output area 510 and the second input/output area 520, a first input/output wiring pattern 517 and a second input/output wiring pattern 527 may be adjacent to each other. A sufficient distance may be secured between the first input/output area 510 and the second input/output area 520, in such a manner that a wiring extending from the first input/output wiring pattern 517 and connected to the core region of the semiconductor device 500, and a wiring extending from the second input/output wiring pattern 527 and connected to the core region of the semiconductor device 500 may be disposed. As an example, the distance between the first input/output area 510 and the second input/output area 520 may be greater than a distance between the first input/output area 310 and the second input/output area 320 in the example embodiment illustrated in FIG. 7.

In the example embodiment illustrated in FIG. 11, in the input/output areas 510 and 520, input/output pins 515 and 525 may be disposed in the first circuit areas 510A and 520A, respectively. Accordingly, lower wiring patterns for connecting the input/output pins 515 and 525 to the electrostatic discharge protection circuit, respectively, may be simplified, which will be described with reference to FIG. 12 below.

FIG. 12 may be a cross-sectional view illustrating a cross section in the direction III-III' of FIG. 11. Referring to FIG. 12, the first input/output pin 515 may be disposed in a first circuit area 510A in the first input/output area 510, and the second input/output pin 525 may be disposed in first circuit area 520A in the second input/output area 520. The input/output pins 515 and 525 are connected to the lower wiring patterns 512 and 522 through upper contacts 514 and 524, and the input/output pins 515 and 525 may be covered with a protective layer 570. The semiconductor elements 511 and 521 and the lower wiring patterns 512 and 522 may be covered with interlayer insulating layers 513 and 523.

By disposing the input/output pins 515 and 525 as illustrated in FIGS. 11 and 12, the structure of the lower wiring patterns 512 and 522 connecting the electrostatic discharge protection circuits and the input/output pins 515 and 525 as illustrated in FIG. 12 may be simplified. In addition, the lower wiring patterns 512 disposed in the first circuit area 510A of the first input/output area 510 may have a structure similar to that of the lower wiring patterns 522 disposed in the second circuit area 520A of the second input/output area 520. Referring to FIG. 12, based on the boundary between the first input/output area 510 and the second input/output area 520, the first input/output area 510 and the second input/output area 520 may have a structure symmetrical to each other in the first direction.

Figure 13:
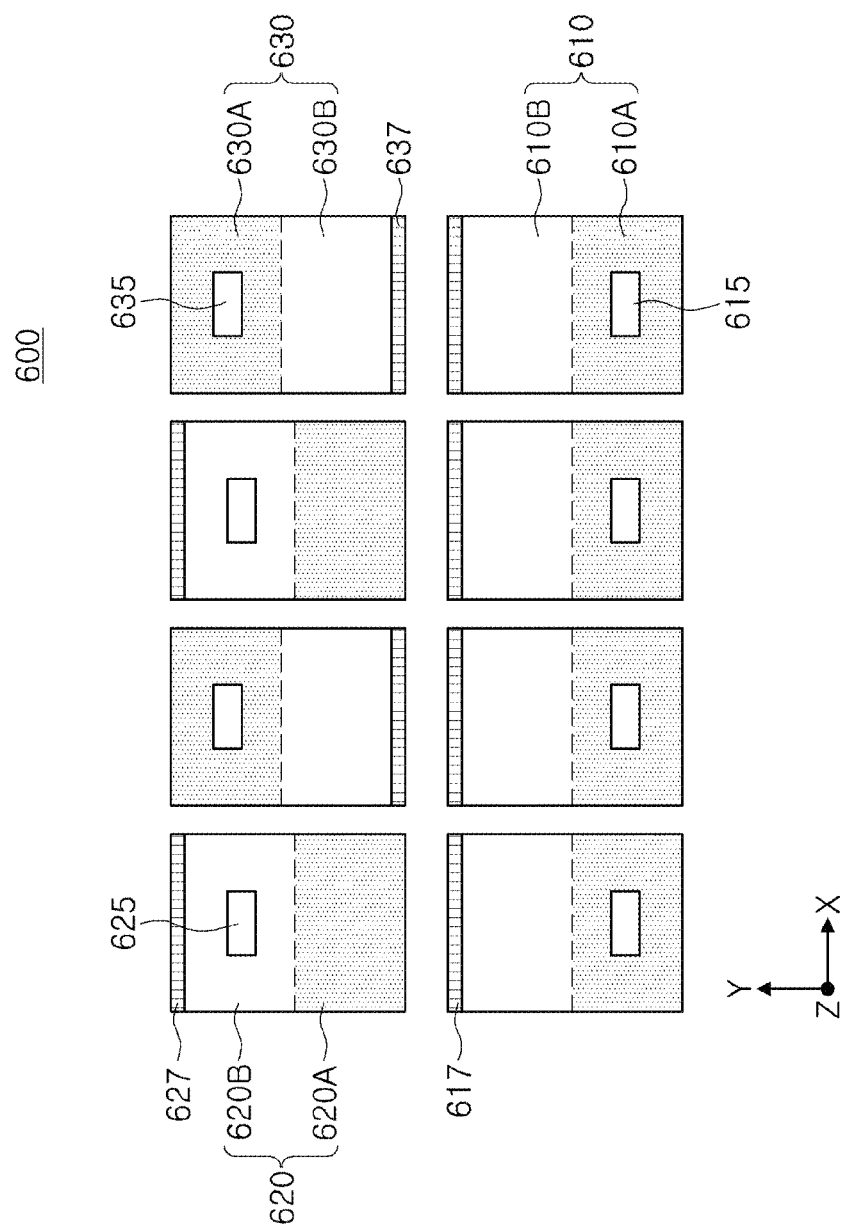
FIG. 13 is a diagram illustrating a semiconductor device according to an example embodiment.

FIG. 13 is a drawing illustrating a semiconductor device according to an example embodiment.

Referring to FIG. 13, a semiconductor device 600 according to an example embodiment may include a plurality of input/output areas 610 to 630. The input/output areas 610 to 630 may include first circuit area 610A, 620A and 630A, and second circuit areas 610B, 620B and 630B, respectively. In addition, the plurality of respective input/output areas (610-630) may be classified as a plurality of input/output areas 610-630, for example, first input/output area 610, second input/output area 620 and third input/output area 630.

Referring to FIG. 13, a first input/output pin 615 in a first input/output area 610 may be disposed in a first circuit area 610A, and a second input/output pin 625 in a second input/output area 620 may be disposed in the second circuit area 620B. In the first input/output area 610 and the second input/output area 620, the first circuit areas 610A and 620A may be disposed below the second circuit areas 610B and 620B in the first direction (a Y-axis direction). On the other hand, in the third input/output area 630, a third input/output pin 635 may be disposed in the first circuit area 630A, and the first circuit area 630A may be disposed on an upper portion of the second circuit area 630B in the first direction. For example, the third input/output area 630 may have a vertical symmetrical structure, compared to the first input/output area 610 and the second input/output area 620.

The example embodiment illustrated in FIG. 13 illustrates that the first input/output areas 610 are arranged in the second direction (the X-axis direction) and the second input/output area 620 and the third input/output area 630 are alternately arranged in the second direction, but is not necessarily limited thereto. As an example, the first input/output areas 610 may be alternately disposed in the first or second direction with the second input/output area 620 or the third input/output area 630, or the first to third input/output areas 610 to 630 may be alternately disposed in the first direction or the second direction.

As described above, the input/output areas 610 to 630 are disposed in the input/output ring of the semiconductor device 600, and a plurality of wirings for transmitting power and signals may be disposed in the input/output ring. The wirings may extend in the second direction. When the input/output areas 610 to 630 having different structures are disposed at the same position in the first direction as in the example embodiment illustrated in FIG. 13, filler regions connecting the wirings may be disposed between the input/output areas 610 to 630.

As described with reference to FIG. 13, by selectively disposing the first to third input/output areas 610-630, a distance between the input/output pins 615, 625 and 635 may be secured, and the bumps may be disposed between the input/output pins 615, 625 and 635. Accordingly, the electrical characteristics of the input/output areas 610 to 630 and the degree of integration of the semiconductor device 600 may be improved. In addition, in addition to the example embodiment described with reference to FIG. 13, as described with reference to FIGS. 9 and 10, the input/output area in which the input/output pin is disposed adjacent to the boundary between the first circuit area and the second circuit area may also be included in the semiconductor device 600 together with the third input/output areas 610 to 630.

Figure 14:
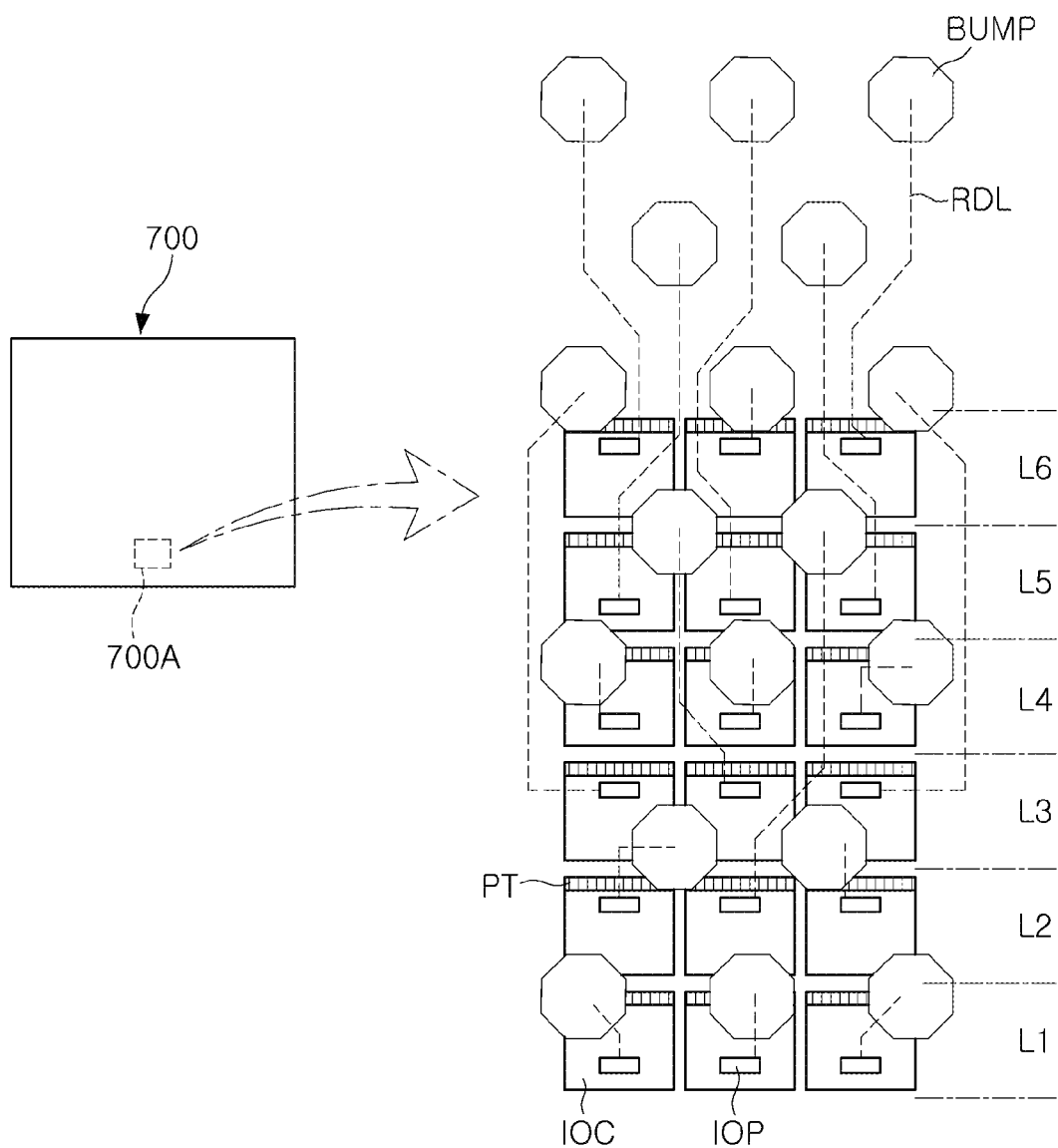
FIGS. 14 to 16 are views illustrating semiconductor devices according to example embodiments.
Figure 15:
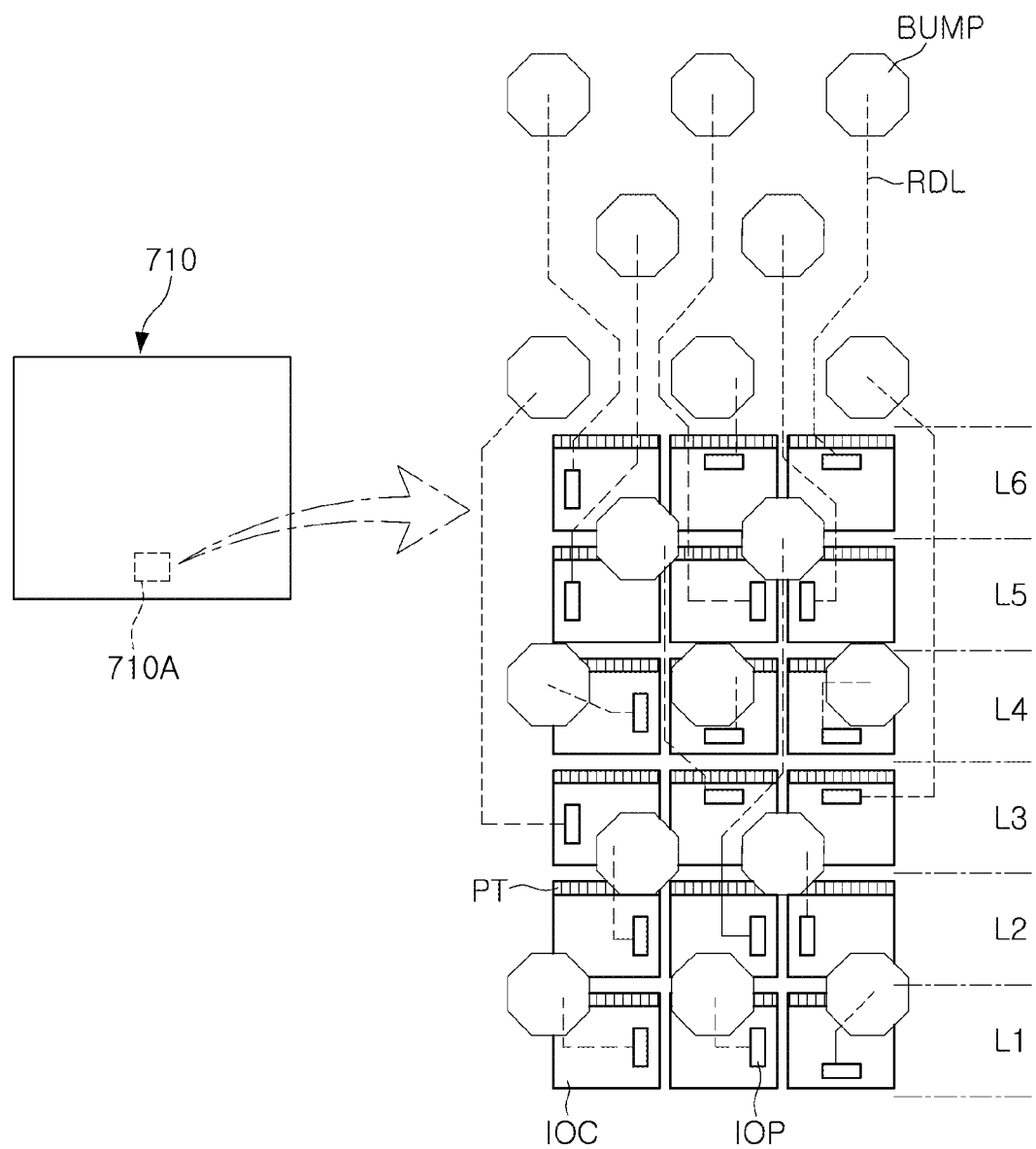
Figure 16:
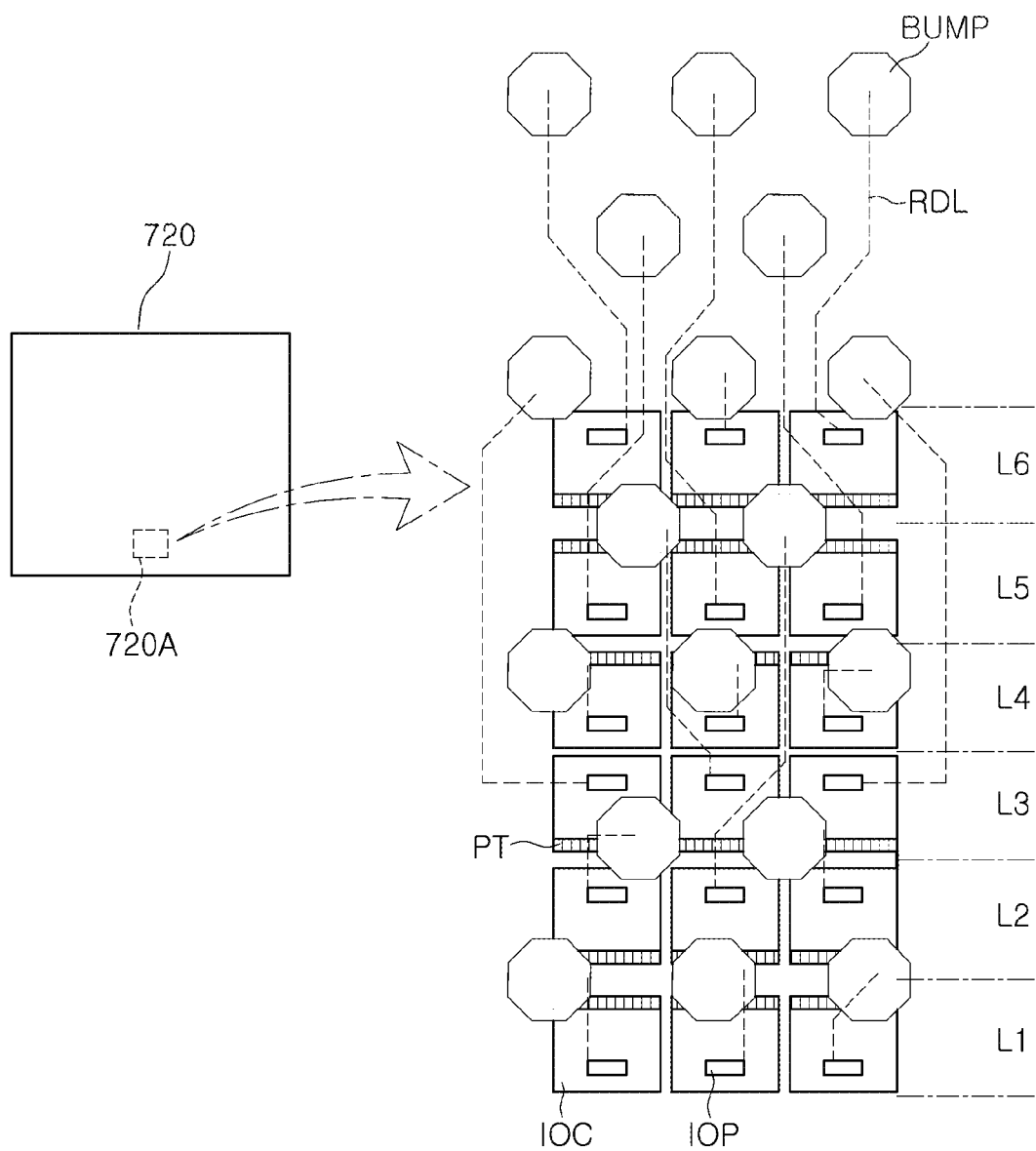

FIGS. 14 to 16 are views illustrating semiconductor devices according to example embodiments.

FIGS. 14 to 16 may be enlarged views of partial regions 700A, 710A and 720A of input/output rings in semiconductor devices 700, 710 and 720, respectively. First, referring to FIG. 14, a plurality of input/output areas IOC and bumps BUMP are disposed in the input/output ring, and the input/output areas IOC and the bumps BUMP may be connected by upper wiring patterns RDL. The input/output areas IOC may be disposed along the plurality of lines L1 to L6, and at least one of the bumps BUMP may be disposed to overlap at least a portion of the input/output areas IOC. Accordingly, an area required for disposing and connecting the bumps BUMP and the input/output areas IOC may be reduced, and the degree of integration of the semiconductor device 700 may be improved.

In the example embodiment illustrated in FIG. 14, input/output pins IOPs may be disposed in different positions in at least a portion of the input/output areas IOC to sufficiently secure a space in which the bumps BUMP may be disposed. As an example, the location of the input/output pin IOP in the input/output areas IOC disposed on a first line L1 may be different from the location of the input/output pin IOP in the input/output areas IOC disposed on a second line L2. For example, positions of the input/output pins IOPs in at least a portion of the input/output areas IOCs may be different from each other in a longitudinal direction.

In addition, in the example embodiment illustrated in FIG. 14, an input/output wiring pattern PT may be disposed at the same position in the input/output areas IOC. Referring to FIG. 14, the input/output wiring pattern PT of each of the input/output areas IOC may be disposed on the upper portion. Accordingly, the input/output wiring patterns PT may not be adjacent to each other at the boundary between the lines L1-L6, and a space in which wiring extending from the input/output wiring pattern PT to the core region of the semiconductor device 700 is to be disposed may be significantly reduced, and a distance between the lines L1 to L6 in which the input/output areas IOC are disposed may be significantly reduced.

Next, referring to FIG. 15, as described with reference to FIG. 14, a plurality of input/output areas IOC and bumps BUMP are disposed in the input/output ring, and the input/output areas IOC and the bumps BUMP may be connected by upper wiring patterns RDL. The input/output areas IOC may be disposed along the plurality of lines L1 to L6, and at least one of the bumps BUMP may be disposed to overlap at least a portion of the input/output areas IOC. Accordingly, an area required for disposing and connecting the bumps BUMP and the input/output areas IOC may be reduced, and the degree of integration of the semiconductor device 710 may be improved.

In the example embodiment illustrated in FIG. 15, positions of the input/output pins IOP included in at least a portion of the input/output areas IOC may be different from each other in a width direction as well as a longitudinal direction. For example, the input/output pins IOP of the input/output areas IOC disposed on the first line L1 may be disposed in different positions. For example, the location of the input/output pin IOP in the respective input/output areas IOC may be determined in consideration of arrangement of the bumps BUMP provided by considering the size of the bumps BUMP and the distance between the bumps BUMP, and a minimum distance to be secured between the bumps BUMP and the input/output pin IOP.

Each of the input/output areas IOC includes an electrostatic discharge protection circuit and a logic circuit, the logic circuit is directly connected to the input/output wiring pattern PT, and the electrostatic discharge protection circuit may be directly connected to one of the bumps BUMP. The electrostatic discharge protection circuit and the logic circuit may be disposed adjacent to each other in a longitudinal direction. Accordingly, in the example embodiment illustrated in FIG. 15, the input/output pins IOP are disposed in the area of the electrostatic discharge protection circuit, may be disposed in the area of the logic circuit, or may be disposed to overlap the boundary between the electrostatic discharge protection circuit and the logic circuit. On the other hand, in the example embodiment illustrated in FIG. 15, the distance between the lines L1-L6 may be similar to that described with reference to FIG. 14.

Referring to FIG. 16, as described with reference to FIGS. 14 and 15, a plurality of input/output areas IOC and bumps BUMP are disposed in an input/output ring, and the input/output areas IOC and the bumps BUMP may be connected by upper wiring patterns RDL. The input/output areas IOC may be disposed along the plurality of lines L1 to L6, and at least one of the bumps BUMP may be disposed to overlap at least a portion of the input/output areas IOC. Accordingly, an area required for disposing and connecting the bumps BUMP and the input/output areas IOC may be reduced, and the degree of integration of the semiconductor device 720 may be improved.

Referring to FIG. 16, at least portions of the input/output areas IOC may have a structure in which they are symmetrical to each other. For example, the input/output areas IOC disposed on the first line L1 and the input/output areas IOC disposed on the second line L2 may have a structure symmetrical to each other in a longitudinal direction. Accordingly, in the example embodiment illustrated in FIG. 16, in each of the input/output areas IOC, the input/output pins TOP may be disposed in a region in which the electrostatic discharge protection circuit is disposed.

On the other hand, in the example embodiment illustrated in FIG. 16, some of the input/output areas IOC have a structure symmetrical to each other, and thus, some of the distances between the lines L1-L6 may be different from each other. For example, a distance between the first line L1 and the second line L2 on which the input/output wiring patterns PT face each other may be greater than a distance between the second line L2 and the third line L3 on which the input/output wiring patterns PT do not face each other. Also, the distance between the third line L3 and the fourth line L4 that are not adjacent to the input/output wiring pattern PT may be less than other distances.

Figure 17:
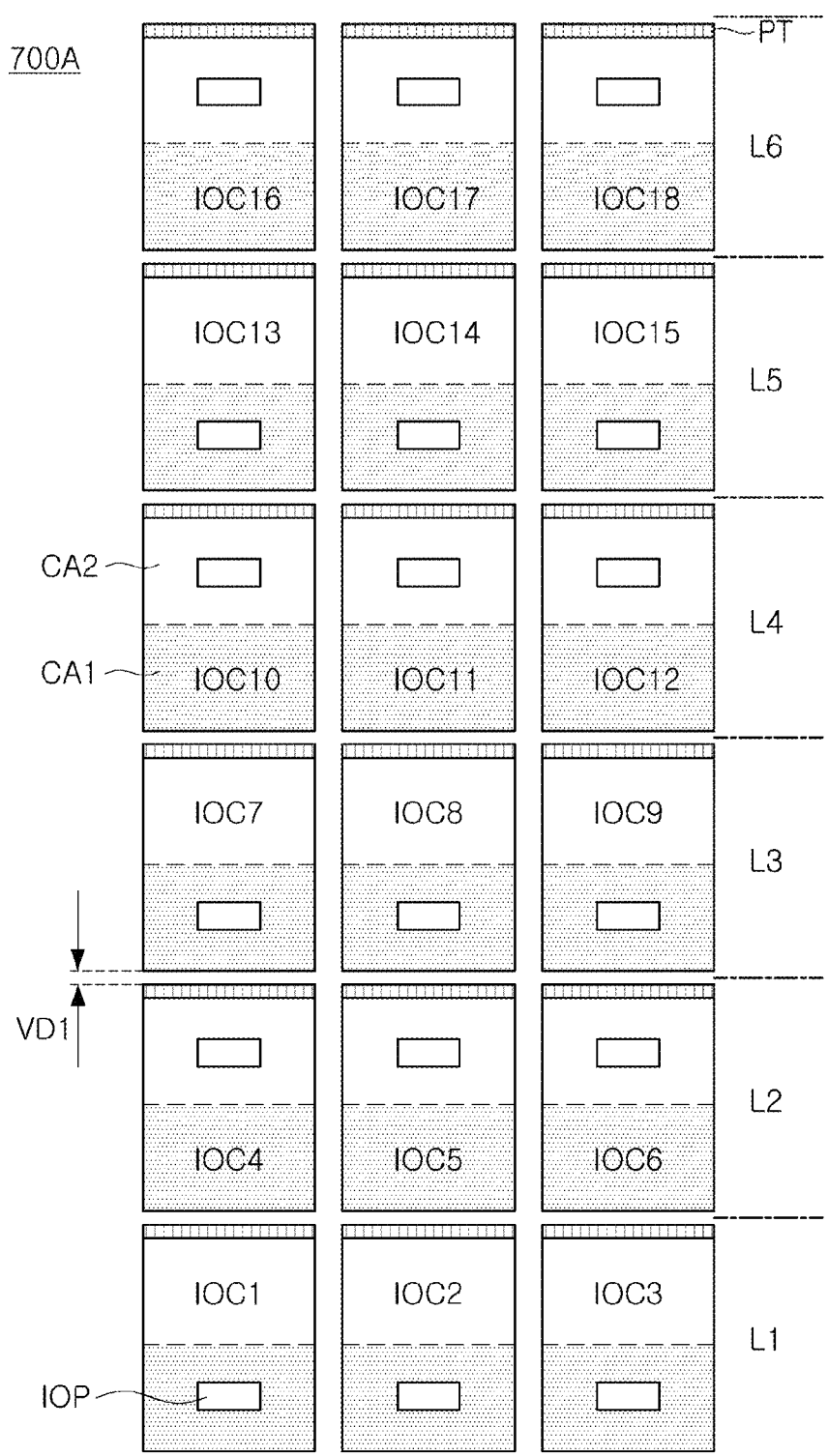
FIGS. 17 and 18 are diagrams provided to illustrate an arrangement of input/output areas in a semiconductor device according to an example embodiment.
Figure 18:
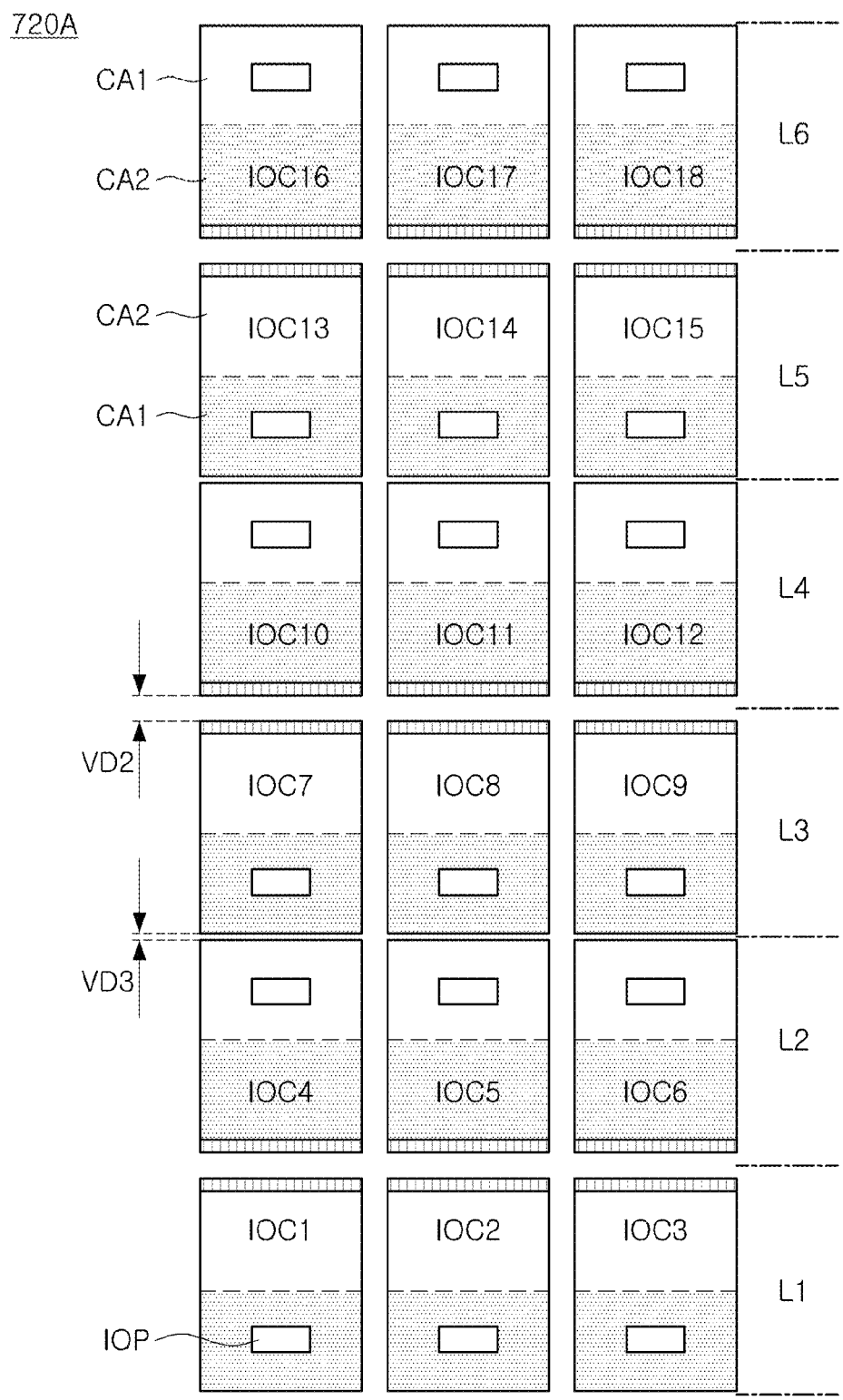

FIGS. 17 and 18 are diagrams provided to illustrate an arrangement of input/output areas in a semiconductor device according to an example embodiment.

First, FIG. 17 may be a diagram illustrating input/output areas IOC1 to IOC18 included in the partial region 700A of the input/output ring in the semiconductor device 700 according to the example embodiment described above with reference to FIG. 14. Referring to FIG. 17, each of the input/output areas IOC1 to IOC18 may include a first circuit area CA1 and a second circuit area CA2, an electrostatic discharge protection circuit is provided in the first circuit area CA1, and a logic circuit may be disposed in the second circuit area CA2. In addition, each of the input/output areas IOC1 to IOC18 includes an input/output pin TOP, and the input/output pin TOP may be connected to the electrostatic discharge protection circuit.

In the example embodiment illustrated in FIG. 17, in each of the input/output areas IOC1-IOC18, the first circuit area CA1 and the second circuit area CA2 may be disposed in the same order. Referring to FIG. 17, in each of the input/output areas IOC1-IOC18, the first circuit area CA1 may be disposed below the second circuit area CA2 in a longitudinal direction. The input/output pins IOP may be disposed in the first circuit area CA1 on odd-numbered lines L1, L3 and L5, and in the second circuit area CA2 on even-numbered lines L2, L4 and L6. Accordingly, wiring patterns connecting the input/output pins IOP and the electrostatic discharge protection circuit on the odd-numbered lines L1, L3 and L5 and the even-numbered lines L2, L4 and L6 may have different structures.

On the other hand, the second circuit area CA2 may include an input/output wiring pattern PT for connecting the logic circuit to the core region of the semiconductor device 700. In the example embodiment illustrated in FIG. 17, the input/output wiring pattern PT may be disposed on an upper portion on the lines L1-L6 in the longitudinal direction. For example, between the lines L1-L6 adjacent in the longitudinal direction, the input/output wiring pattern PT may be adjacent to the first circuit area CA1, not other input/output wiring patterns PT. Accordingly, as illustrated in FIG. 17, a vertical distance VD1 between the lines L1-L6 may be uniformly formed.

Next, referring to FIG. 18, each of the input/output areas IOC1-IOC18 may include a first circuit area CA1 and a second circuit area CA2, an electrostatic discharge protection circuit may be formed in the first circuit area CA1, and a logic circuit may be formed in the second circuit area CA2. In addition, an input/output pin IOP connected to the electrostatic discharge protection circuit in each of the input/output areas IOC1 to IOC18 may be disposed in the first circuit area CAL Unlike the example embodiment of FIG. 17 in which the input/output pin IOP is disposed in the first circuit area CA1 or the second circuit area CA2, in the example embodiment of FIG. 18, the input/output pin IOP may be disposed in the first circuit area CA1. Accordingly, wiring patterns connecting the input/output pins IOP and the electrostatic discharge protection circuit in the respective input/output areas IOC1 to IOC18 may have a similar structure. For example, in the example embodiment illustrated in FIG. 18, wiring patterns connecting the input/output pin IOP and the electrostatic discharge protection circuit may not overlap the boundary between the first circuit area CA1 and the second circuit area CA2.

Also, referring to FIG. 18, the input/output wiring patterns PT may face each other between at least portions of the lines L1-L6. For example, the input/output wiring patterns PT may face each other, between the first line L1 and the second line L2, between the third line L3 and the fourth line L4, and between the fifth line L5 and the sixth line L6. Thus, a vertical distance VD2 between the first line L1 and the second line L2, between the third line L3 and the fourth line L4, and between the fifth line L5 and the sixth line L6 may be greater than the first vertical distance VD1 described with reference to FIG. 17.

On the other hand, the input/output wiring pattern PT may not be disposed between the second line L2 and the third line L3 and between the fourth line L4 and the fifth line L5. Accordingly, a third vertical distance VD3 between the second line L2 and the third line L3 and between the fourth line L4 and the fifth line L5 may be formed to be less than the first vertical distance VD1 previously described with reference to FIG. 17.

Figure 19:
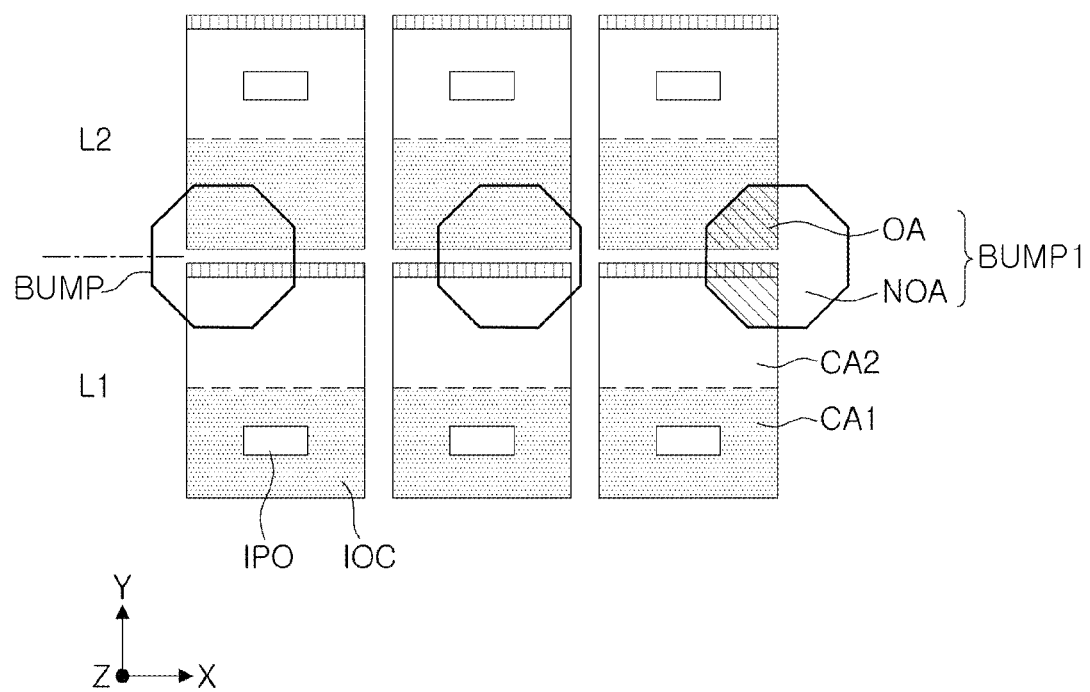
FIGS. 19 and 20 are views provided to illustrate arrangement of input/output areas and bumps in a semiconductor device according to an example embodiment.
Figure 20:
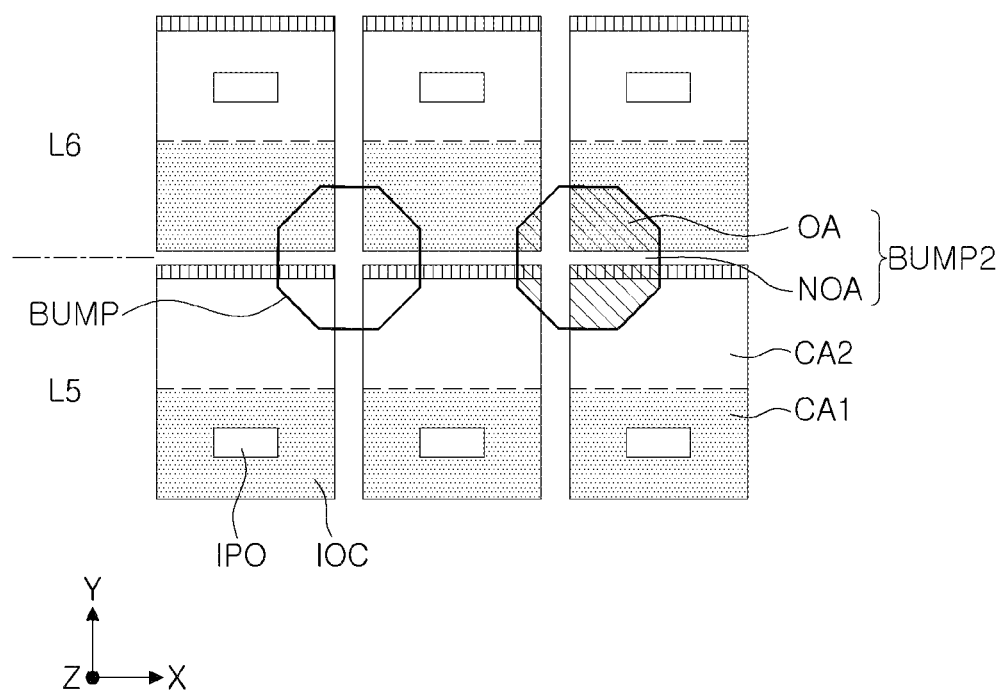

FIGS. 19 and 20 are views provided to illustrate arrangement of input/output areas and bumps in a semiconductor device according to an example embodiment.

First, referring to FIG. 19, input/output areas IOC are disposed along a first line L1 and a second line L2, and bumps BUMP may be disposed to overlap the input/output areas IOC. The bumps BUMP may be separated from the input/output pins IOP included in the input/output areas IOC and other adjacent bumps BUMP by a desired and/or alternatively predetermined distance or more, respectively.

For example, in the arrangement of the bumps BUMP, a width of each of the bumps BUMP and a distance between the bumps BUMP may be considered. The distance between the bumps BUMP may be sufficiently secured so that the bumps BUMP are separated from each other and may be connected to a circuit pattern of a package substrate or the like by a solder ball or the like.

In addition, in disposing the bumps BUMP, a minimum distance to be secured between the bumps BUMP may be considered. The minimum distance may be defined as the distance between the centers of the bumps BUMP, and the bumps BUMP may need to be disposed in such a manner that the distance between one of the bumps BUMP and the other bumps BUMP adjacent thereto is equal to or greater than the minimum distance. The minimum distance between the bumps BUMP may be determined depending on the number of bumps BUMP, the size of each of the bumps BUMP, the size of a semiconductor device including the bumps BUMP, or the like.

When disposing the bumps BUMP and the input/output areas IOC, the positions of the input/output pins IOP included in the respective input/output areas IOC may be considered. The input/output pin IOP is a structure connected to the bumps BUMP through a wiring pattern, and may be disposed at the same height as the bumps BUMP and the wiring pattern. Therefore, if a sufficient distance between each of the bumps BUMP and the input/output pin IOP is not secured, a defect such as an electric short may occur.

Referring to FIG. 19, the input/output pin IOP is disposed in the first circuit area CA1 of each of the input/output areas IOC on the first line L1, and the input/output pin IOP is disposed in the second circuit area CA2 of each of the input/output areas IOC on the second line L2, thereby securing a sufficient area between the input/output pins IOP. Accordingly, the bumps BUMP may be disposed between the input/output pins IOP in the first direction (the Y-axis direction).

In the example embodiment illustrated in FIG. 19, the bumps BUMP may include an overlapping area OA and a non-overlapping area NOA. Referring to the rightmost first bump BUMP1 in FIG. 19, the overlapping area OA of the first bump BUMP1 may include areas overlapping a pair of input/output areas IOC adjacent in the first direction. In the first bump BUMP1, the overlapping area OA may have a smaller area than the non-overlapping area NOA.

Next, referring to FIG. 20, the input/output areas IOC are disposed along the fifth line L5 and the sixth line L6, and the bumps BUMP are disposed to overlap the input/output areas IOC. In the example embodiment illustrated in FIG. 20, the bumps BUMP may also include an overlapping area OA and a non-overlapping area NOA, and in the second bump BUMP2, the non-overlapping area NOA may have an area greater than an overlapping area OA.

As described with reference to FIGS. 19 and 20, depending on the arrangement of the input/output areas IOC and the bumps BUMP, the area of the overlapping area OA and the non-overlapping area NOA may have a different magnitude relationship. In addition, according to example embodiments, at least one of the bumps BUMP may not overlap the input/output areas IOC, and may not include the overlap region OA.

Figure 21:
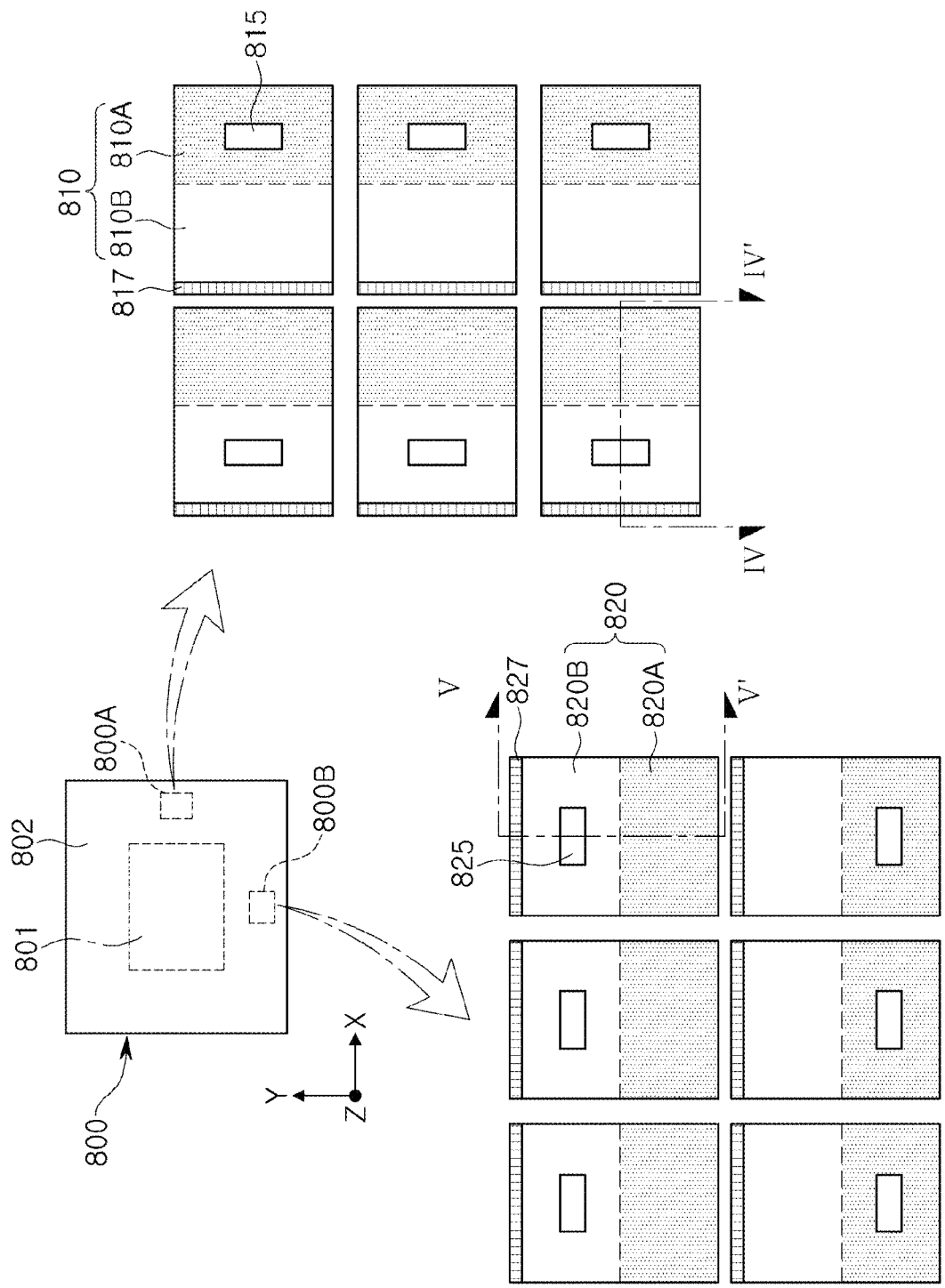
FIGS. 21 and 22 are views illustrating a semiconductor device according to an example embodiment.
Figure 22:
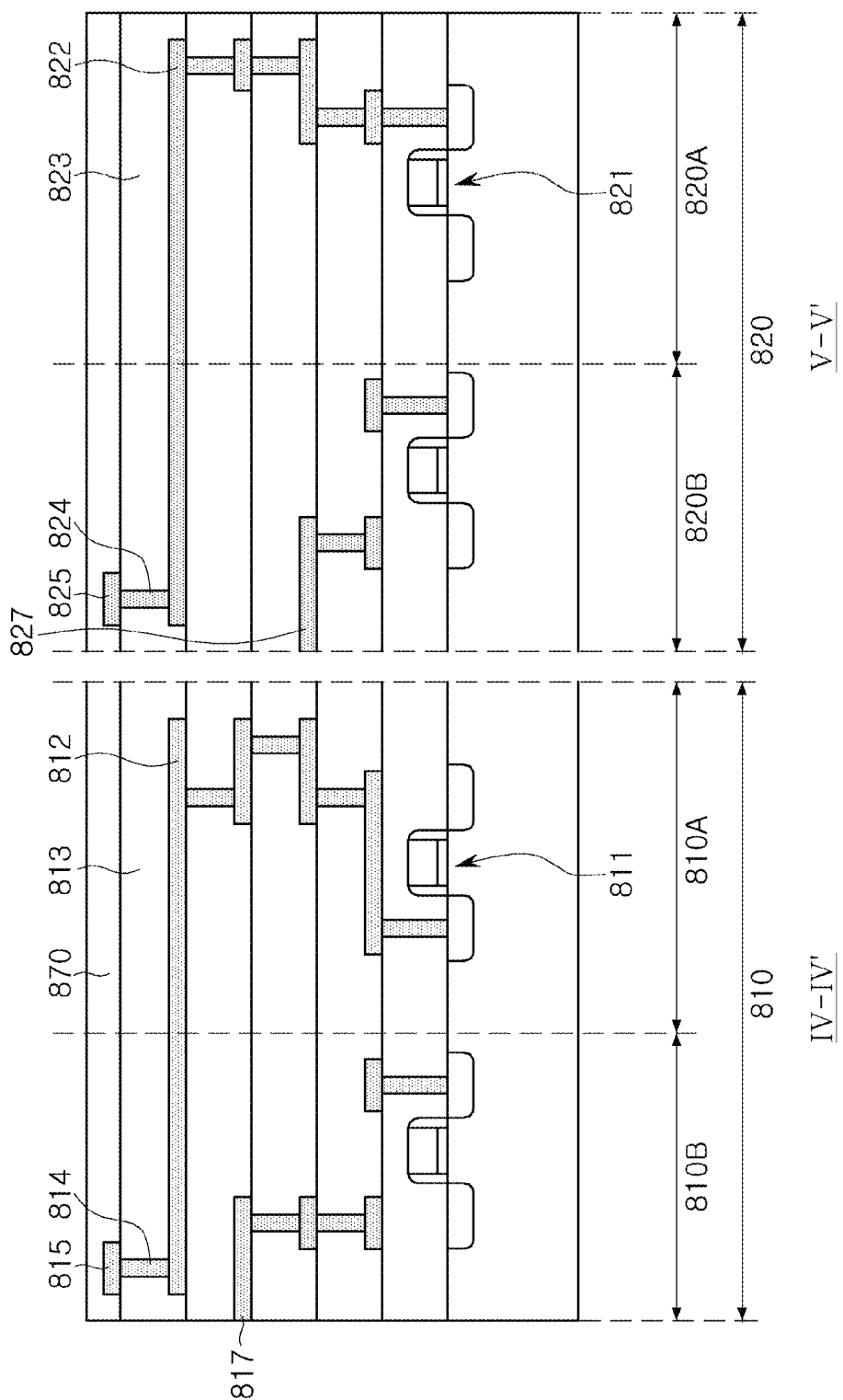

FIGS. 21 and 22 are views illustrating a semiconductor device according to an example embodiment.

First, referring to FIG. 21, a semiconductor device 800 may include a first area 801 and a second area 802, the first area 801 may be a core region, and the second area 802 may be an input/output ring. The second area 802 may surround the first area 801. The second area 802 may include a horizontal region 800A adjacent to an edge extending in the first direction (the Y-axis direction) among the edges of the semiconductor device 800, and a vertical region 800B adjacent to an edge extending in the second direction (the X-axis direction) among the edges of the semiconductor device 800.

The input/output ring may include a plurality of input/output areas 810 and 820. Each of the input/output areas 810 and 820 may include first circuit areas 810A and 820A and second circuit areas 810B and 820B, and an electrostatic discharge protection circuit is disposed in the first circuit areas 810A and 820A, and a logic circuit may be disposed in the second circuit areas 810B and 820B. The input/output areas 810 and 820 may include input/output pins 815 and 825, respectively, and the input/output pins 815 and 825 may be disposed in the first circuit areas 810A and 820A or the second circuit areas 810B and 820B.

The logic circuit of the second circuit areas 810A and 820A may be connected to the core region 801 through input/output wiring patterns 817 and 827. Referring to FIG. 21, the input/output wiring patterns 817 of the input/output areas 810 included in the horizontal region 800A are adjacent to the core region 801 in the second direction, and the input/output wiring patterns 827 of the input/output areas 820 included in the vertical region 800B may be adjacent to the core region 801 in the first direction. In an example embodiment, by disposing the input/output wiring pattern 817 included in the horizontal area 800A and the input/output wiring pattern 827 included in the vertical area 800B at different heights, overlapping of input/output wiring patterns 817 and 827 may be limited and/or prevented, and the core region and the input/output ring may be efficiently connected, which will be described below with reference to FIG. 22.

FIG. 22 may be a cross-sectional view illustrating a cross section in a direction IV-IV' and a cross section in a direction V-V' of FIG. 21. Referring to FIG. 22, the input/output pins 815 and 825 may be disposed in the second circuit areas 810B and 820B, respectively. The input/output pins 815 and 825 are connected to the lower wiring patterns 812 and 822 through the upper contacts 814 and 824, and the input/output pins 815 and 825 may be covered with a protective layer 870. In the first input/output area 810 and the second input/output area 820, semiconductor elements 811 and 821 may provide an electrostatic discharge protection circuit and a logic circuit together with at least a portion of the lower wiring patterns 812 and 822, respectively. The semiconductor elements 811 and 821 and the lower wiring patterns 812 and 822 may be covered with interlayer insulating layers 813 and 823.

Referring to FIG. 22, the height at which the input/output wiring pattern 817 is disposed in the first input/output area 810 may be different from the height at which the input/output wiring pattern 827 is disposed in the second input/output area 820. For example, in the first input/output area 810, the input/output wiring pattern 817 may be disposed on an odd-numbered layer, and in the second input/output area 820, the input/output wiring pattern 827 may be disposed on an even-numbered layer. Alternatively, on the contrary, the input/output wiring pattern 817 in the first input/output area 810 may be disposed on an even-numbered layer, and in the second input/output area 820, the input/output wiring pattern 827 may be disposed on the odd-numbered layer. As illustrated in FIG. 22, by disposing the input/output wiring patterns 817 and 827 at different heights, a wiring connecting the input/output areas 810 and 820 and the core region 801 may be efficiently designed.

Figure 23:
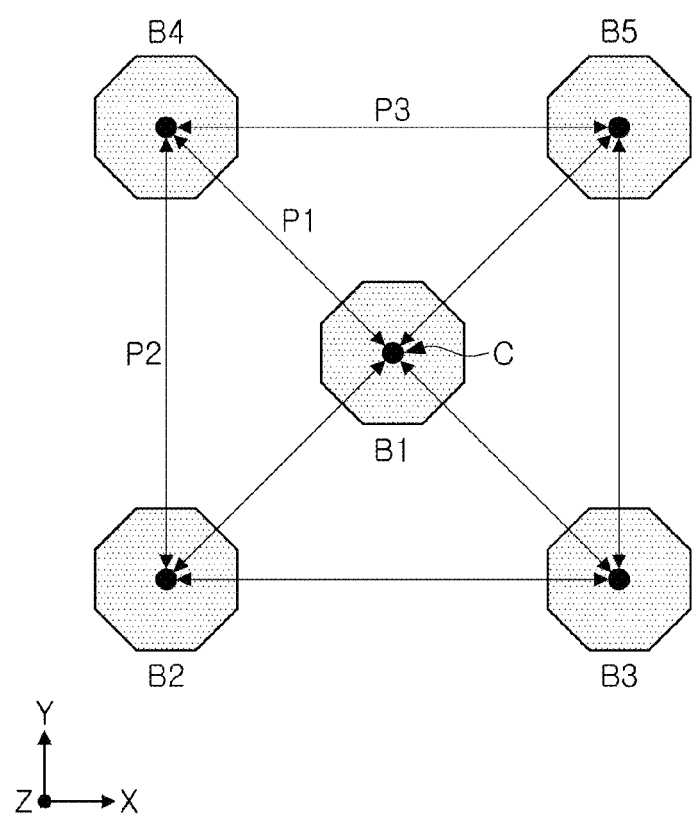
FIG. 23 is a diagram provided to illustrate the arrangement of bumps in a semiconductor device according to an example embodiment.

FIG. 23 is a diagram provided to illustrate the arrangement of bumps in a semiconductor device according to an example embodiment.

In the semiconductor device according to the example embodiment, the bumps B1 to B5 may be disposed according to a desired and/or alternatively predetermined design rule. Referring to FIG. 23, second to fifth bumps B2-B5 may be disposed around a first bump B1. Although the bumps B1-B5 are illustrated to have an octagonal shape on the XY plane, this is only an example, and the shapes of the bumps B1-B5 may be variously modified.

Distances P1-P3 between the bumps B1-B5 may be defined as the distance from a center C of each of the bumps B1-B5 to a center C of each of the other adjacent bumps B1-B5. For example, the center C may be the center of gravity of each of the bumps B1-B5.

The distances P1-P3 between the bumps B1-B5 may be determined in a range in which an error does not occur in a design rule check (DRC) included in a manufacturing process of a semiconductor device. As an example, the design rule of the semiconductor device may define a minimum distance that should be secured between the bumps B1 to B5. The distances P1-P3 between the bumps B1-B5 may be determined to be greater than or equal to a minimum distance defined in the design rule. For example, when the first bump B1 is described as an example, the first distance P1 between each of the other bumps B2-B5 around the first bump B1, and the first bump B1, may be a minimum distance or more defined by a design rule. In addition, the second distance P2 and the third distance P3 between the second to fifth bumps B2-B5 disposed around the first bump B1 may also be equal to or greater than the minimum distance defined in the design rule.

Figure 24:
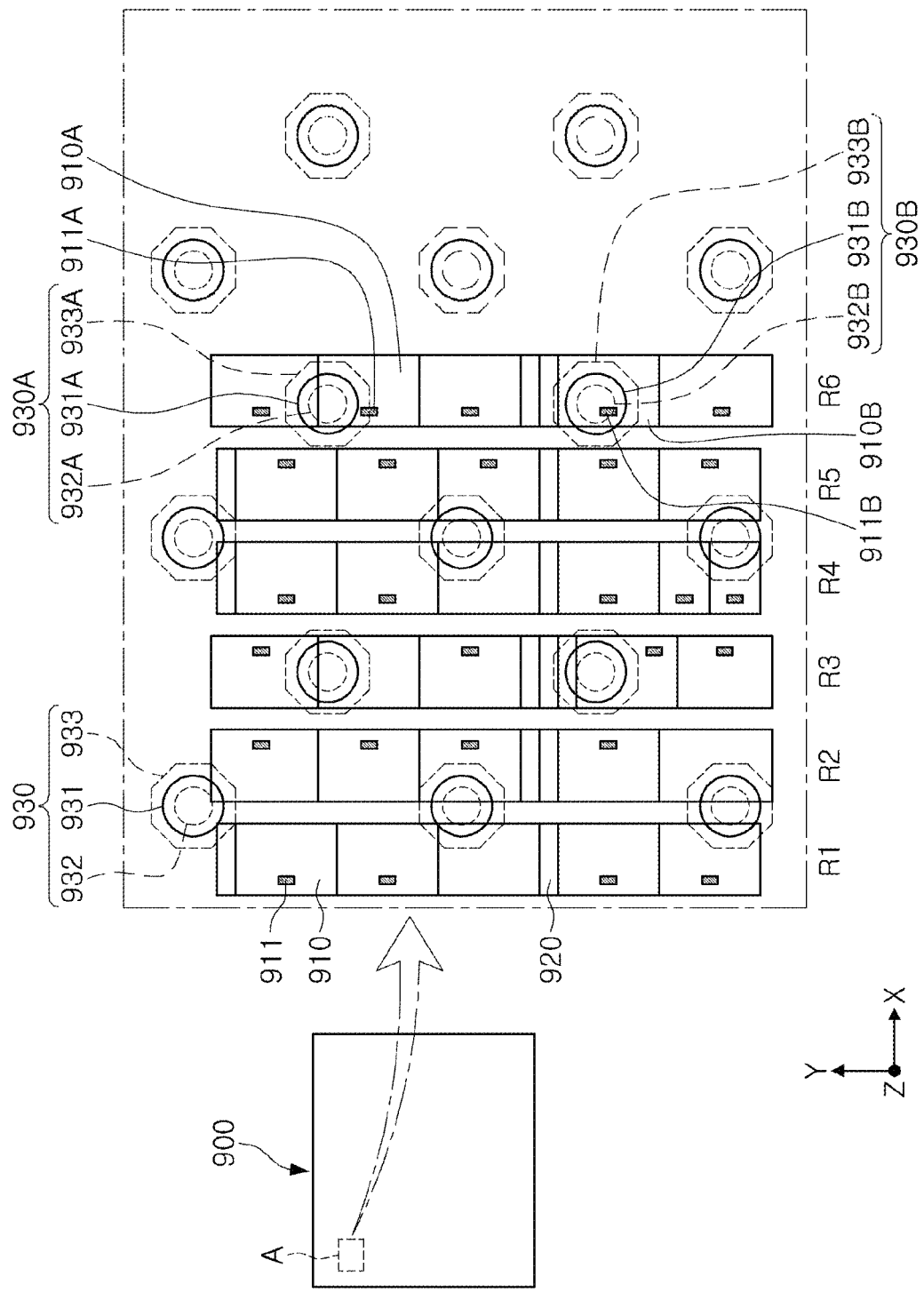
FIGS. 24 to 26 are views illustrating semiconductor devices according to example embodiments.
Figure 25:
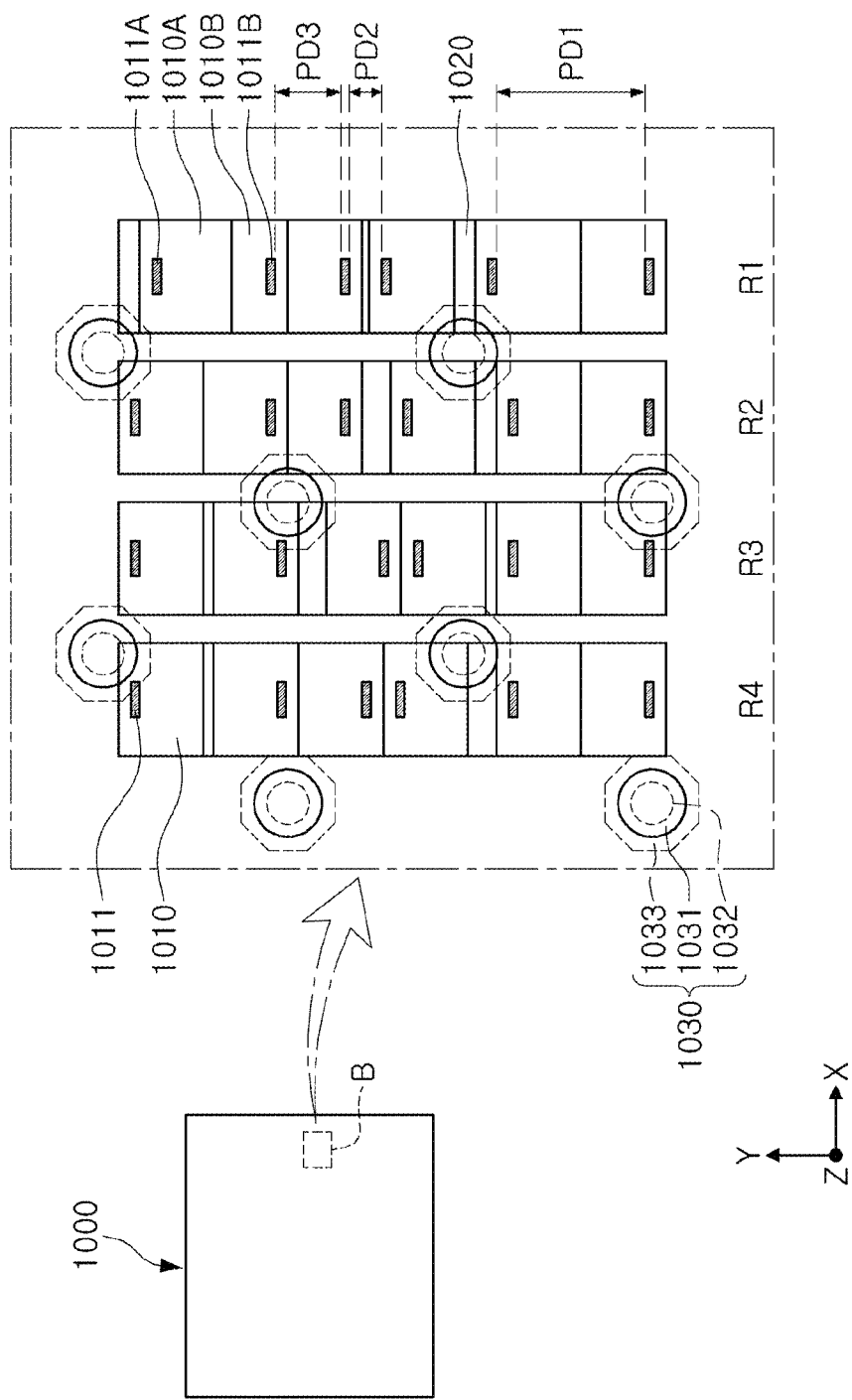
Figure 26:
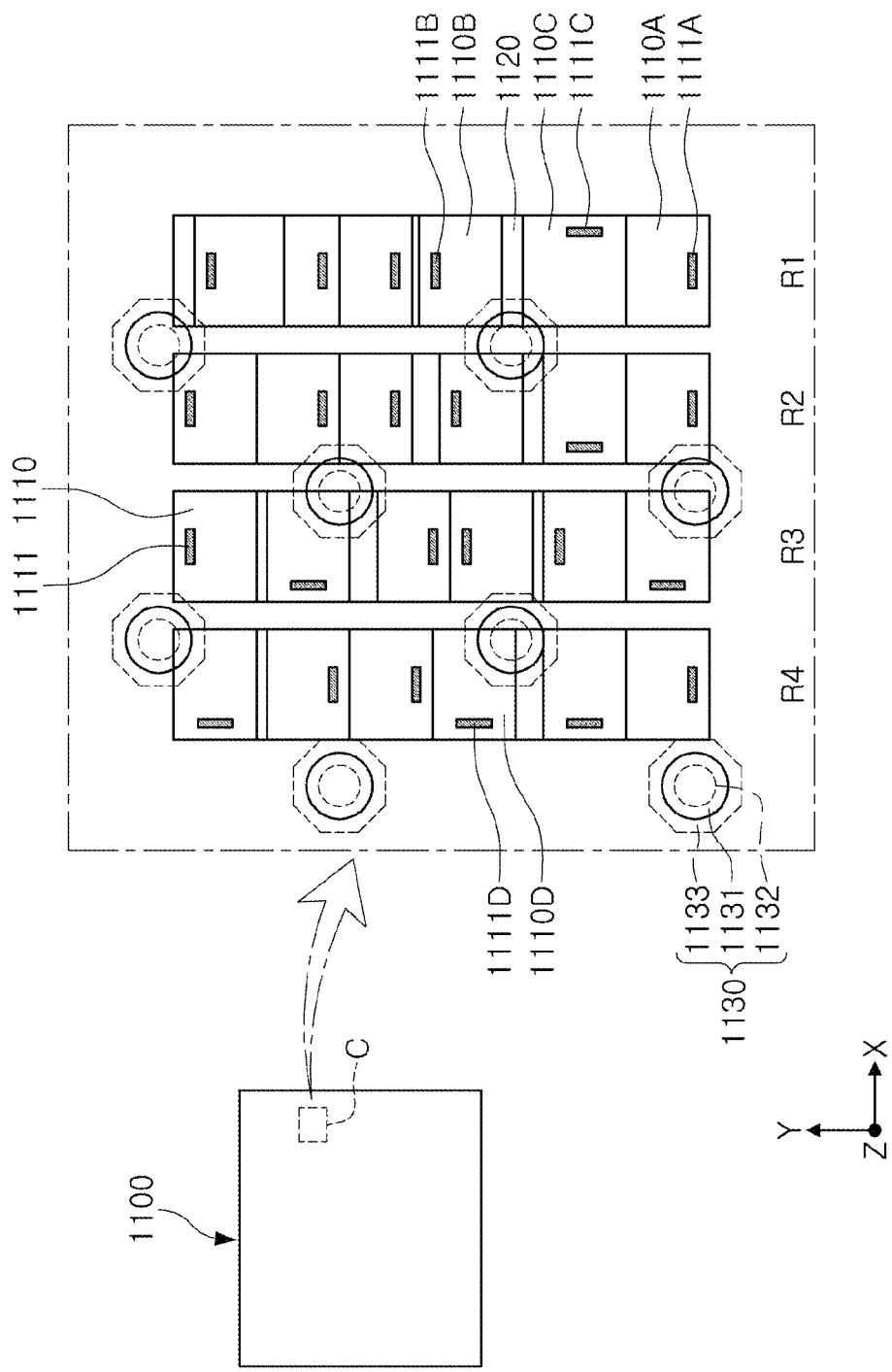

FIGS. 24 to 26 are views illustrating semiconductor devices according to example embodiments.

First, referring to FIG. 24, a region corresponding to a portion of a semiconductor device 900 is enlarged. Referring to FIG. 24, a plurality of input/output areas 910, a plurality of link regions 920, and a plurality of bumps 930 may be disposed in an area A. In the example embodiment illustrated in FIG. 24, the input/output areas 910 and the link regions 920 may be continuously disposed. As an example, compared to the other embodiments described above, the input/output areas 910 and the link regions 920 may be disposed continuously without an empty space in which the input/output areas 910 or the link regions 920 are not intentionally disposed.

Each of the input/output areas 910 may include an input/output pin 911. As described above, the input/output pins 911 may be disposed substantially at the same height as the bumps 930. In the example embodiment illustrated in FIG. 24, positions in which the input/output pins 911 are disposed may be changed depending on respective rows in which the input/output areas 910 are disposed. For example, in odd-numbered first, third, and fifth rows R1, R3 and R5, the input/output pin 911 is disposed on the left side of each of the input/output areas 910, and in the even-numbered second, fourth and sixth rows R2, R4, and R6, the input/output pin 911 may be disposed on the right side of each of the input/output regions 910. Accordingly, a sufficient space may be secured between the input/output pins 911, and at least a portion of the bumps 930 may be disposed to overlap the input/output areas 910.

The link regions 920 are regions for connecting at least a portion of the input/output areas 910 to each other, and an input/output pin 911 may not be formed in the link regions 920. For example, the input/output areas 910 included in the first to sixth rows R1 to R6 through the link regions 920 may receive a power voltage and a ground voltage in common. In this case, it may be understood that the input/output areas 910 included in the first to sixth rows R1 to R6 are included in the same voltage domain. When at least portions of the first to sixth rows R1 to R6 are included in different voltage domains, the link regions 920 may connect only the rows R1 to R6 included in the same voltage domain to each other.

The arrangement of the bumps 930 may be determined in consideration of the positions of the input/output pins 911 and a minimum distance between the bumps 930 described with reference to FIG. 23. As an example, a minimum distance between the bumps 930 may be defined according to a design rule applied to manufacturing the semiconductor device 900. The bumps 930 may be disposed so that the distance between the bumps 930 is equal to or greater than the minimum distance defined by the design rule, and the input/output pin 911 and the bumps 930 do not interfere with each other.

On the other hand, referring to FIG. 24, input/output areas 910 included in each of the rows R1 to R6 are disposed without a distance, and a desired and/or alternatively predetermined distance may be formed between the rows R1 to R6. The distance between the rows R1 to R6 may be several to tens of micrometers, and the distance between the rows R1 to R6 may be changed depending on a design rule of the semiconductor device 900. As an example, unlike illustrated in FIG. 24, a distance may be present between the input/output areas 910 included in each of the rows R1 to R6, or the input/output areas 910 may also be disposed such that a distance may not be present between the rows R1 to R6.

In an example embodiment, in disposing the input/output areas 910 and the bumps 930, the input/output pin 911 and the bump 930 may overlap in at least one of the input/output areas 910. For example, in the example embodiment illustrated in FIG. 24, a first input/output pin 911A and a first bump 930A may overlap each other, and a second input/output pin 911B and a second bump 930B may overlap each other.

As previously described with reference to FIG. 5B and the like, each of the bumps 930 may include a solder bump 931, an upper bump pattern 932, and a lower bump pattern 933. The lower bump pattern 933 may be disposed at the same height as the input/output pin 911, and the upper bump pattern 932 and the solder bump 931 have a different height from the input/output pin 911, for example, may be disposed to be higher than the input/output pin 911. The example embodiment in FIG. 24 illustrates that the area of the lower bump pattern 933 is the largest and the area of the upper bump pattern 932 is the smallest in each of the bumps 930, but is only an example, and may be variously modified. In an example embodiment, in the case in which pressure is applied to the solder bump 931 for connection between the semiconductor device 900 and the package substrate, when the input/output pin 911 is positioned below the upper bump pattern 932, the input/output pin 911 may be damaged by the pressure.

Therefore, in the process of mounting the semiconductor device 900 on the package substrate, a minimum distance between the upper wiring pattern 932 of each of the bumps 930 and the input/output pin 911, required to limit and/or prevent damage to the input/output pin 911, may be defined in the design rule of the semiconductor device 900. In an example embodiment, the minimum distance may be defined as a distance between the center of the upper wiring pattern 932 of each of the bumps 930 and the center of the input/output pin 911. If a distance equal to or greater than the minimum distance may be secured, each of the bumps 930 and the input/output pin 911 may overlap each other.

For example, in the example embodiment illustrated in FIG. 24, the first input/output pin 911A and the first bump 930A may overlap each other in the XY plane. An upper bump pattern 932A in direct contact with the solder bump 931A in the first bump 930A may be separated from the first input/output pin 911A by a desired and/or alternatively predetermined distance in the XY plane as illustrated in FIG. 24. When the distance is greater than the minimum distance defined in the design rule, the first input/output pin 911A and the first bump 930A may be disposed to overlap each other as illustrated in FIG. 24.

On the other hand, referring to FIG. 24, although it is illustrated that the second input/output pin 911B and the second bump 930B overlap each other, this may not be allowed by the design rule. For example, in the second bump 930B, the upper bump pattern 932B in direct contact with the solder bump 931B may directly overlap the second input/output pin 911B. Accordingly, the distance between the upper bump pattern 932B and the second input/output pin 911B may be less than the minimum distance defined in the design rule. In this case, when the semiconductor device 900 is manufactured as illustrated in FIG. 24, the second input/output pin 911B may be damaged by pressure applied to the second bump 930B in a process such as mounting the semiconductor device 900 on a package substrate. To solve the above problem, the position of the second bump 930B may be moved, or the second bump 930B may be removed and the second input/output area 910B may be connected to the other one of the bumps 930. Alternatively, the positions of the input/output pins 911 in the input/output areas 910 of the sixth row R6 may be changed.

Next, referring to FIG. 25, an enlarged view of an area B corresponding to a portion of a semiconductor device 1000 is illustrated. Referring to FIG. 25, a plurality of input/output areas 1010, a plurality of link regions 1020, and a plurality of bumps 1030 may be disposed in the area B. In the example embodiment illustrated in FIG. 25, arrangements of the input/output areas 1010, the link regions 1020, and the bumps 1030 may be similar to those described with reference to FIG. 24. As an example, the input/output areas 1010 and the link regions 1020 may be continuously disposed in at least one direction (a Y-axis direction of FIG. 25) without an empty space.

Each of the input/output areas 1010 may include an input/output pin 1011. In the example embodiment illustrated in FIG. 25, in a pair of input/output areas 1010 adjacent to each other in a first direction parallel to an edge of the semiconductor device 1000 (the Y-axis direction), the input/output pins 1011 may be disposed in different locations. When the input/output areas 1010 are formed and the input/output pins 1011 are disposed as in the example embodiment illustrated in FIG. 25, metal patterns for providing a signal transmission path may be formed in the link regions 1020.

Referring to a first input/output area 1010A and a second input/output area 1010B adjacent in the first direction in the example embodiment illustrated in FIG. 25, first and second input/output pins 1011A and 1011B may be disposed in different positions in the first and second input/output areas 1010A and 1010B, respectively. For example, each of the input/output areas 1010 may include an electrostatic discharge protection circuit and a logic circuit disposed in a second direction (an X-axis direction), and the input/output pin 1011 may overlap a boundary between the logic circuit and the electrostatic discharge protection circuit. As illustrated in FIG. 25, by disposing the input/output pins 1011, the distances between the input/output pins 1011 are variously expressed as a first distance PD1, a second distance PD2, and a third distance PD3.

Similar to the example embodiment described above with reference to FIG. 24, at least a portion of the bumps 1030 may be disposed to overlap the input/output areas 1010. Each of the bumps 1030 includes a solder bump 1031, an upper bump pattern 1032, a lower bump pattern 1033 and the like, and the lower bump pattern 1033 may be disposed at the same height as the input/output pin 1011. In an example embodiment, a minimum distance between the center of the upper wiring pattern 1032 of each of the bumps 1030 and the center of the input/output pin 1011 may be defined according to a design rule. When the minimum distance is secured, at least one of the bumps 1030 may also overlap the input/output pin 1011.

In an example embodiment illustrated in FIG. 26, the positions of input/output pins 1111 in input/output areas 1110 may be more diverse than those illustrated in FIGS. 24 and 25. Referring to FIG. 26, positions in which input/output pins 1111A to 1111D are disposed in the first to fourth input/output areas 1110A to 1110D may be different from each other. As an example, the first input/output pin 1111A and the second input/output pin 1111B may be disposed in different positions in the first direction (the Y-axis direction) in the first and second input/output areas 1110A and 1110B. For example, the first input/output pin 1111A and the second input/output pin 1111B may have an X-axis symmetric relationship with each other.

The third input/output pin 1111C and the fourth input/output pin 1111D may have a Y-axis symmetric relationship with each other. In addition, the third input/output pin 1111C may be disposed in a position in which the first input/output pin 1111A is rotated by 90 degrees in a counterclockwise direction, and the fourth input/output pin 1111D may be disposed in a position in which the second input/output pin 1111B is rotated by 90 degrees counterclockwise.

As illustrated in FIG. 26, in disposing the input/output pins 1111 in the respective input/output areas 1110, the locations of the input/output pins 1111 may be variously determined. Accordingly, a sufficient distance between the input/output pins 1111 for disposing bumps 1130 may be secured, and reliability and electrical characteristics of a semiconductor device 1100 may be improved.

When comparing FIGS. 25 and 26, the input/output pin 1111 of the input/output area 1110 disposed secondly from the top in the first direction in a third row R3 may be disposed by being rotated 90 degrees counterclockwise. Therefore, in a manner different from the example embodiment of FIG. 25 in which the bump 1030 and the input/output pin 1011 overlap each other, the input/output pin 1111 may not overlap with the bump 1130 in the example embodiment illustrated in FIG. 26.

However, in the example embodiment illustrated in FIG. 25, the lower bump pattern 1033 of the bump 1030 may also overlap the input/output pin 1011 according to the design rule, and the overlapping between the upper bump pattern 1032 and the input/output pin 1011 may only be prohibited. Accordingly, according to the design rule, the semiconductor device 1000 may be designed such that only the lower bump pattern 1033 of the bump 1030 overlaps the input/output pin 1011 as in the example embodiment illustrated in FIG. 25.

FIGS. 27 to 30 are diagrams illustrating semiconductor devices according to example embodiments.

Figure 27:
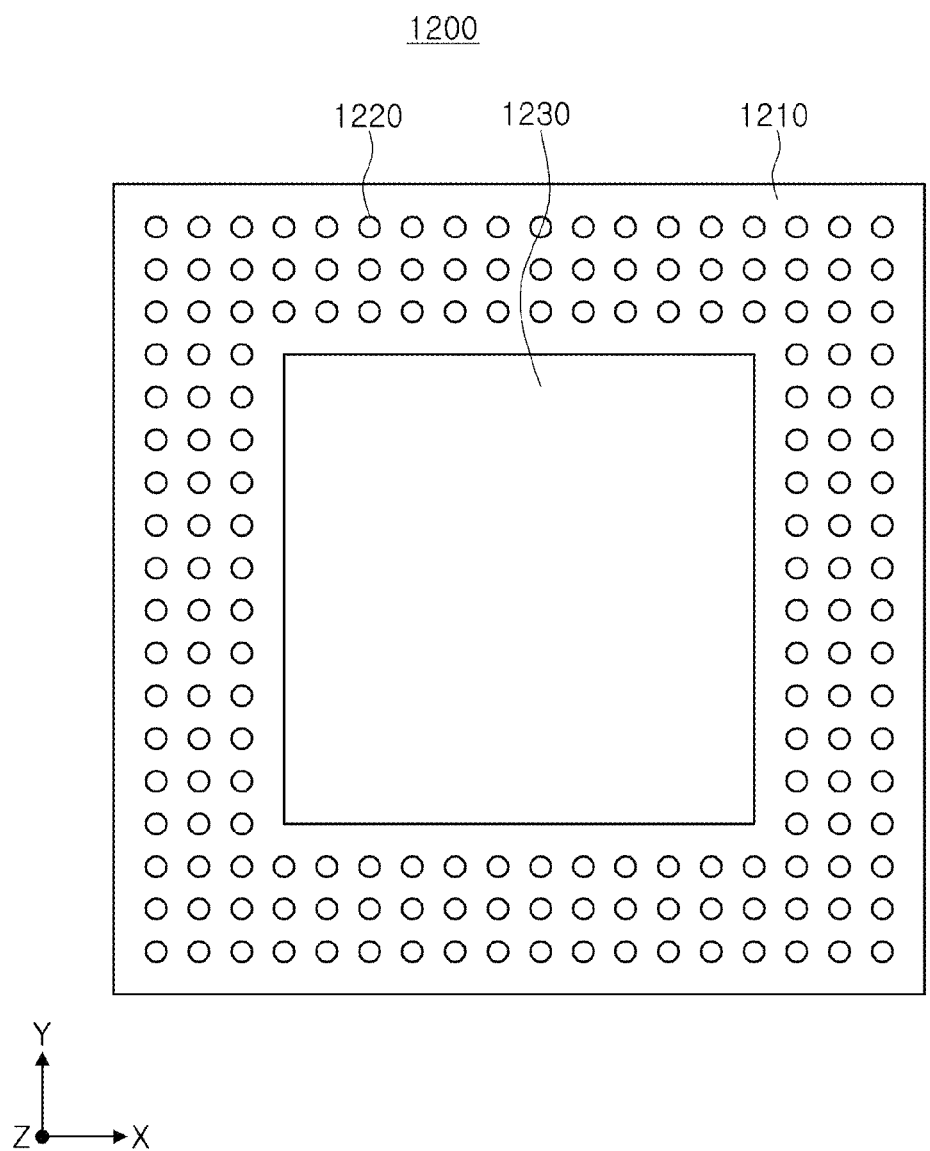
FIGS. 27 to 30 are diagrams illustrating semiconductor devices according to example embodiments.

First, referring to FIG. 27, a semiconductor device 1200 according to an example embodiment may include an input/output ring 1210, a core region 1230 and the like, and bumps 1220 may be disposed in the input/output ring 1210. The input/output ring 1210 is an area around the core region 1230 and may include the bumps 1220 and input/output areas connected to the bumps 1220. In addition, a plurality of power wirings extending to traverse the input/output areas may be disposed in the input/output ring 1210.

The input/output areas may have different sizes depending on the magnitude of the voltage received through the bumps 1220. The input/output ring 1210 may include a link region for connecting power wirings, between the input/output areas having different sizes, which will be described below in more detail with reference to FIG. 28.

Figure 28:
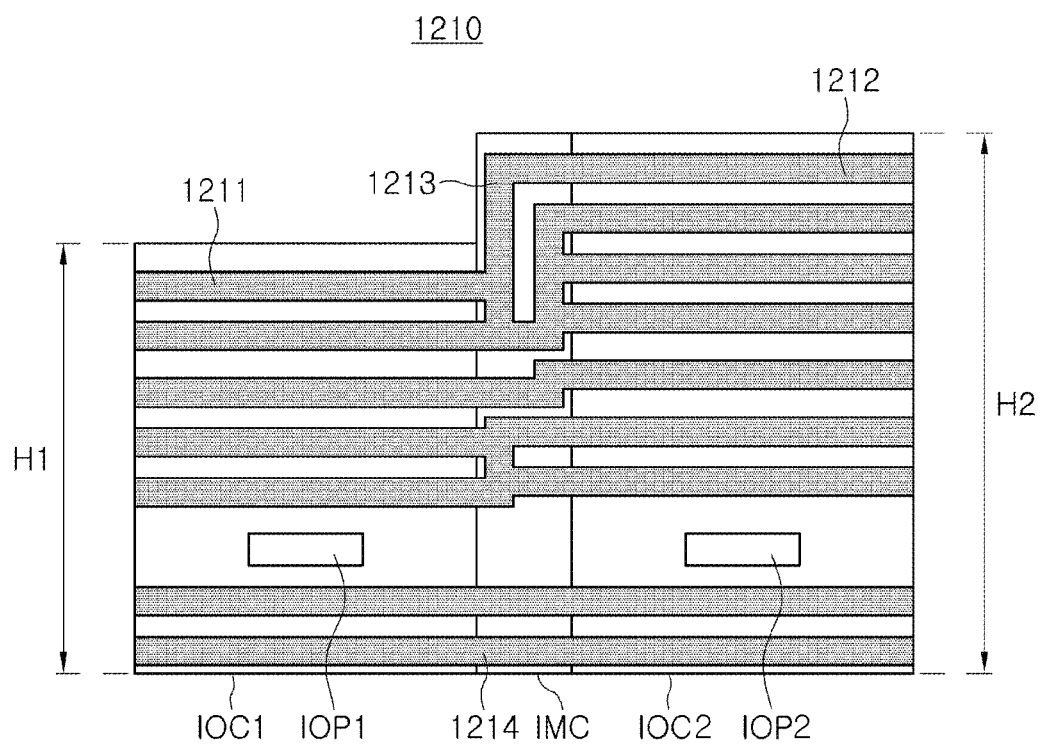

Referring to FIG. 28, a first input/output area IOC1 and a second input/output area IOC2 receiving different voltages may be included in the input/output ring 1210. For example, the first input/output area IOC1 may have a first height H1, and the second input/output area IOC2 may have a second height H2. The first height H1 may be less than the second height H2. The first input/output area IOC1 may input/output a signal having a relatively low voltage, and the second input/output area IOC2 may input/output a signal having a relatively high voltage. The first input/output area IOC1 is connected to a redistribution layer through a first input/output pin IOP1, and the redistribution layer may be connected to the bump. The second input/output area IOC2 may be connected to the redistribution layer through a second input/output pin IOP2.

In the example embodiment illustrated in FIG. 28, a link region IMC may be disposed between the first input/output area IOC1 and the second input/output area IOC2 inputting/outputting signals having different voltages. The link region IMC may connect a first wiring 1211 and a second wiring 1212 to each other, between the first input/output area IOC1 and the second input/output area IOC2. In the example embodiment illustrated in FIG. 28, the first wiring 1211 and the second wiring 1212 may be disposed as different patterns in the first input/output area IOC1 and the second input/output area IOC2, respectively. Accordingly, intermediate wirings 1213 and 1214 connecting the first wiring 1211 and the second wiring 1212 to each other may be disposed in the link region IMC. The intermediate wirings (1213 and 1214) may include a first intermediate wiring 1213 having a curved shape to connect the first wiring 1211 and the second wiring 1212 disposed in different positions in one direction (a longitudinal direction of FIG. 28), and a second intermediate wiring 1214 connecting the first wiring 1211 and the second wiring 1212 disposed in the same position in the one direction.

Figure 29:
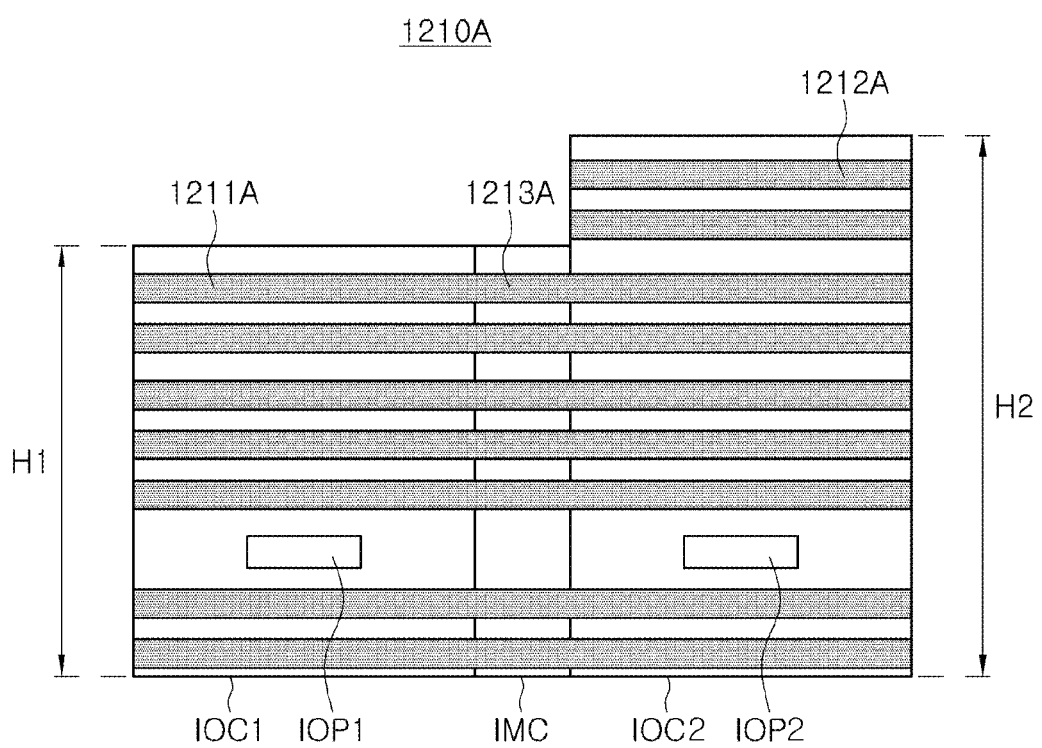

Next, referring to FIG. 29, as in the example embodiment illustrated in FIG. 20, a first input/output area IOC1 and a second input/output area IOC2 receiving different voltages may be included in an input/output ring 1210A. The first input/output area IOC1 inputs and outputs a signal of a relatively low voltage and may have a first height H1, and the second input/output area IOC2 inputs and outputs a signal of a relatively high voltage and may have a second height H2. A link region IMC may be disposed between the first input/output area IOC1 and the second input/output area IOC2.

In the example embodiment illustrated in FIG. 29, in the first input/output area IOC1 and the second input/output area IOC2, a first wiring 1211A and a second wiring 1212A may be disposed in the same pattern, respectively. Accordingly, an intermediate wiring 1213A disposed in the link region IMC may not have a curved shape. Since the intermediate wiring 1213A may be designed simply, the area of the link region IMC in the input/output ring 1210A according to the example embodiment illustrated in FIG. 29 may be smaller than the area of the link region IMC in the input/output ring 1210 according to the example embodiment illustrated in FIG. 28. According to example embodiments, one semiconductor device 1200 may also include both the input/output ring 1210 according to the example embodiment illustrated in FIG. 28 and the input/output ring 1210A according to the example embodiment illustrated in FIG. 29.

Figure 30:
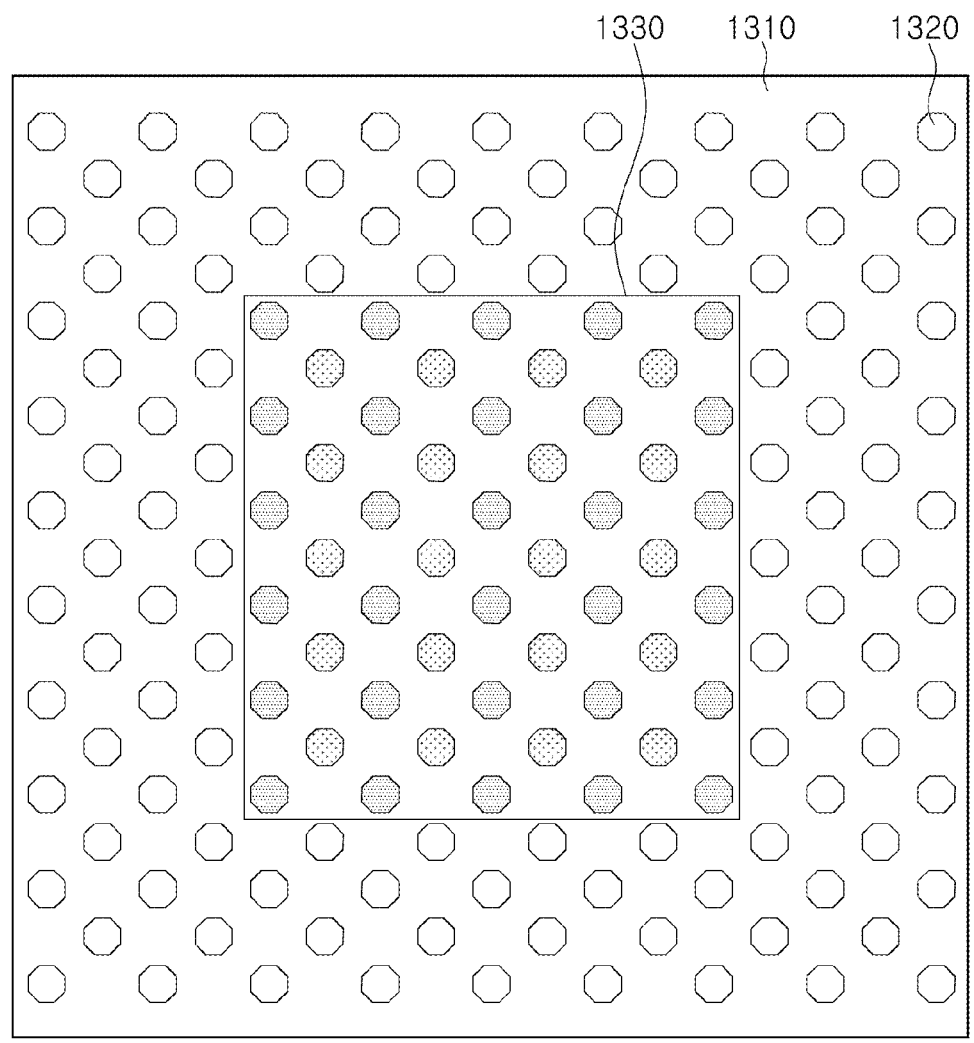

Next, referring to FIG. 30, a semiconductor device 1300 according to an example embodiment may include an input/output ring 1310, a core region 1330 and the like, and bumps 1320 may be disposed on the entirety of one surface of the semiconductor device 1300. For example, the semiconductor device 1300 may input/output a signal through the bumps 1320 disposed in the input/output ring 1310, and may receive power through the bumps 1320 disposed in the core region 1330. Although the example embodiment in FIG. 30 illustrates that all of the bumps 1320 disposed in the core region 1330 are used to receive power, a portion of the bumps 1320 for inputting and outputting signals may be disposed in the core region 1330. Conversely, a portion of the bumps 1320 for receiving power may also be disposed in the input/output ring 1310.

In an example embodiment, positions of input/output pins of input/output areas connected to the bumps 1320 may not be fixed. As an example, in the input/output area, the input/output pin may be disposed in a first circuit area in which an electrostatic discharge protection circuit is formed, or may be disposed in a second circuit area in which a logic circuit is formed. When the input/output pin is disposed in the second circuit area, the input/output pin may be connected to the electrostatic discharge protection circuit by a wiring pattern extending to traverse a boundary between the first circuit area and the second circuit area.

In addition, according to example embodiments, the input/output pins may be disposed to be adjacent to the boundary of the input/output areas in a second direction rather than a first direction in which the first circuit area and the second circuit area are adjacent to each other. According to an example embodiment, the input/output pin may be adjacent to a boundary between the first circuit area and the second circuit area. By disposing the input/output pins in various locations as described above, a space in which the bumps 1320 are disposed may be secured between the input/output pins of the input/output areas, and the design difficulty of the semiconductor device 1300 may be reduced. In addition, the number of layers in which wiring patterns connecting the bumps 1320 and the input/output areas are disposed may be reduced, and the length of the redistribution layers connecting the bumps 1320 and the input/output areas may be reduced to improve the electrical characteristics of the semiconductor device 1300.

Figure 31:
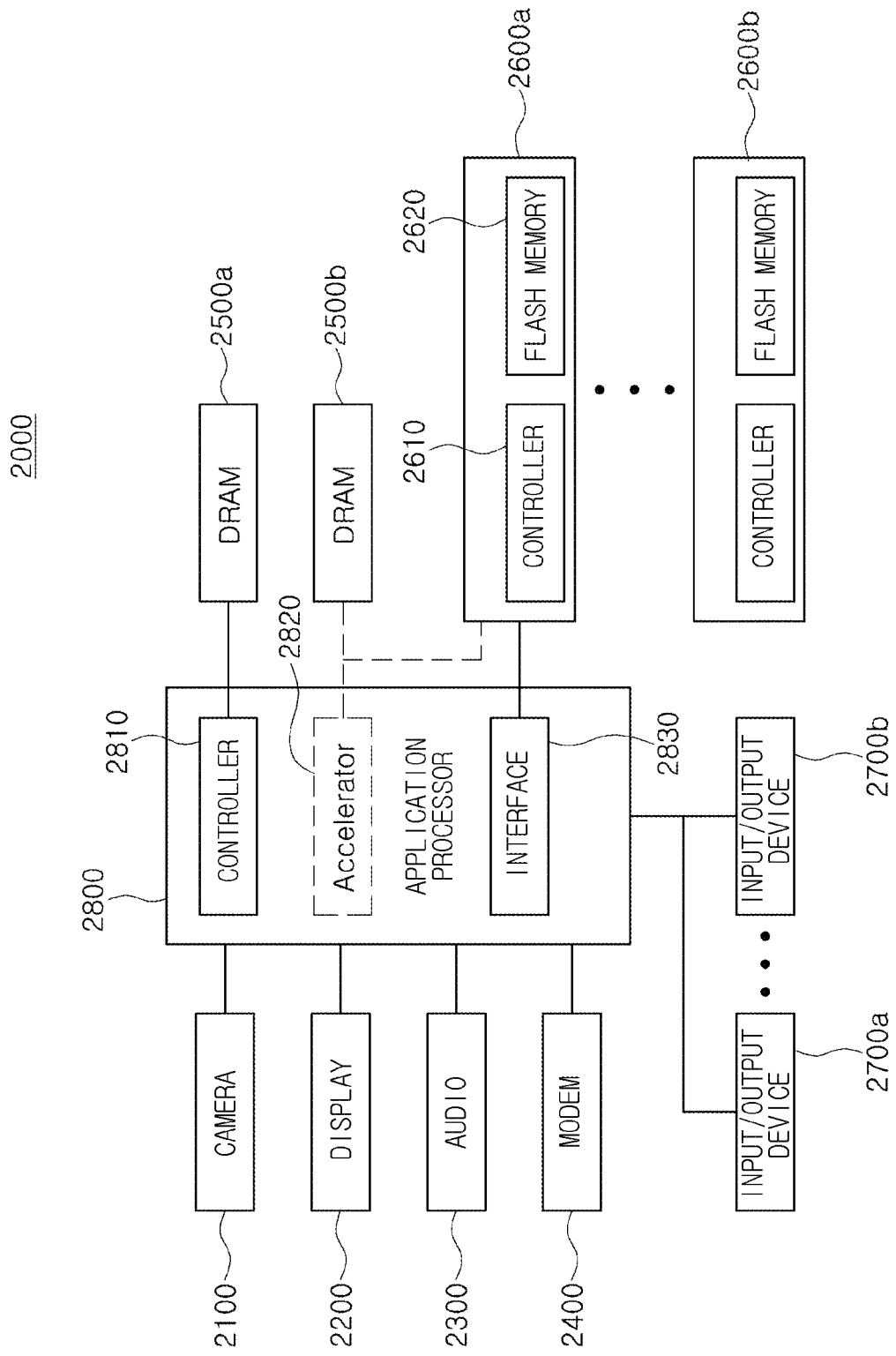
FIG. 31 is a block diagram schematically illustrating a mobile system including a semiconductor device according to an example embodiment.

FIG. 31 is a block diagram schematically illustrating a mobile system including a semiconductor device according to an example embodiment.

Referring to FIG. 31, a mobile system 2000 may include a camera 2100, a display 2200, an audio processing unit 2300, a modem 2400, DRAMs 2500a and 2500b, flash memory devices 2600a and 2600b, and input/output devices 2700a and 2700b, and an application processor ("AP") 2800.

The mobile system 2000 may be implemented as a laptop computer, a portable terminal, a smartphone, a tablet PC, a wearable device, a healthcare device, or an Internet-of-Things (IoT) device. In addition, the mobile system 2000 may be implemented as a server or a personal computer.

The camera 2100 may capture a still image or a video under the user's control. The mobile system 2000 may acquire specific information by using a still image/video captured by the camera 2100 or may convert the still image/video into another type of data such as text and store the data. Alternatively, the mobile system 2000 may recognize a character string included in a still image/video photographed by the camera 2100 and provide a text or audio translation corresponding to the character string. As such, the field of use of the camera 2100 in the mobile system 2000 is increasingly diversified. In an example embodiment, the camera 2100 may transmit data such as a still image/video to the AP 2800 according to a D-Phy or C-Phy interface based on the MIPI standard.

The display 2200 may be implemented in various forms such as a liquid crystal display (LCD), an organic light emitting diodes (OLED) display, active-matrix organic light-emitting diode (AM-OLED), plasma display panel (PDP), field emission display (FED), or electronic paper. In an example embodiment, the display 2200 may also be used as an input device of the mobile system 2000 by providing a touch screen function. In addition, the display 2200 may be provided integrally with a fingerprint sensor or the like to provide a security function of the mobile system 2000. In an example embodiment, the AP 2800 may transmit image data to be displayed on the display 2200, to the display 2200, according to a D-Phy or C-Phy interface based on the MIPI standard.

The audio processing unit 2300 may process audio data stored in the flash memory devices 2600a and 2600b or audio data included in content received externally through the modem 2400 or the input/output devices 2700a and 2700b. For example, the audio processing unit 2300 may include processing circuitry for performing various processes such as coding/decoding, amplification, and noise filtering for audio data.

The modem 2400 modulates and transmits signals to transmit/receive wired/wireless data, and demodulates signals received externally to restore the original signal. The input/output devices 2700a and 2700b are devices that provide digital input/output, and may include a port that may be connected to an external recording medium, an input device such as a touch screen, a mechanical button key or the like, an output device outputting vibrations in a haptic or other schemes, and the like. In some examples, the input/output devices 2700a and 2700b may be connected to an external recording medium through ports such as a USB, lightning cable, SD card, micro SD card, DVD, network adapter, or the like.

The AP 2800 may control the overall operation of the mobile system 2000. In detail, the AP 2800 may control the display 2200 such that a part of the contents stored in the flash memory devices 2600a and 2600b is displayed on the screen. In addition, when the user input is received through the input/output devices 2700a and 2700b, the AP 2800 may perform a control operation corresponding to the user input.

The AP 2800 may be provided as a system-on-chip (SoC) driving an application program, an operating system (OS), or the like. Also, the AP 2800 may be included in one semiconductor package and other devices included in the mobile system 2000, for example, the DRAM 2500a, a flash memory 2620, and/or a memory controller 2610. For example, the AP 2800 and at least one or more devices may be provided in the form of a package, such as Package on Package (PoP), Ball grid arrays (BGAs), Chip scale packages (CSPs), System-In-Package (SIP), Multi Chip Package (MCP), Wafer-level Fabricated Package (WFP), Wafer-Level Processed Stack Package (WSP), or the like. The kernel of the operating system running on the AP 2800 may include a device driver for controlling the flash memory devices 2600a and 2600b and an input/output scheduler. The device driver may control the access performance of the flash memory devices 2600a and 2600b by referring to the number of synchronous queues managed by the input/output scheduler, or may control the CPU mode inside the SoC, Dynamic Voltage and Frequency Scaling (DVFS) level, or the like.

In an example embodiment, the AP 2800 may include a processor block that executes an operation or drives an application program and/or an operating system, and various other peripheral components connected to a processor block through a system bus. Peripheral components may include a memory controller, internal memory, power management block, error detection block, monitoring block and the like. The processor block may include one or more cores, and in the case in which a plurality of cores are included in the processor block, each of the cores includes a cache memory, and a common cache shared by the cores may be included in the processor block.

In an example embodiment, the AP 2800 may also include an Accelerator block 2820 that is a dedicated circuit for AI data computation. Alternatively, according to example embodiments, a separate accelerator chip may be provided separately from the AP 2800, and a DRAM 2500*b* may be additionally connected to the accelerator block 2820 or the accelerator chip. The accelerator block 2820 is a function block that professionally performs a specific function of the AP 2800, and includes a Graphics Processing Unit (GPU) that is a functional block and specializes in processing graphic data, a Neural Processing Unit (NPU) which is a block for professionally performing AI calculation and inference, a Data Processing Unit (DPU) which is a block specializing in data transmission, and the like.

According to an example embodiment, the mobile system 2000 may include a plurality of DRAMs 2500*a* and 2500*b*. In an example embodiment, the AP 2800 may include a controller 2810 controlling the DRAMs 2500*a* and 2500*b*, and the DRAM 2500*a* may be directly connected to the AP 2800.

The AP 2800 controls DRAM by setting commands and Mode Register Set (MRS) conforming to the JEDEC standard, or may perform communications by setting specifications and functions, such as low voltage/high speed/reliability, required by the mobile system 2000 and DRAM interface protocol for CRC/ECC. For example, the AP 2800 may communicate with the DRAM 2500*a* through an interface conforming to JEDEC standard standards such as LPDDR4, LPDDR5 or the like. Alternatively, the AP 2800 sets a new DRAM interface protocol to control the DRAM 2500*b* for an accelerator, having a higher bandwidth than that of the DRAM 2500*a*, by the accelerator block 2820 or an accelerator chip provided separately from the AP 2800, thereby performing communications.

Although only DRAMs 2500*a* and 2500*b* are illustrated in FIG. 31, the configuration of the mobile system 2000 is not necessarily limited to this type, an memories other than DRAMs 2500*a* and 2500*b* may also be included in the mobile system 2000 depending on the bandwidth, response speed, and voltage conditions of the AP 2800 or the accelerator block 2820. In an example, the controller 2810 and/or the accelerator block 2820 may control various memories such as PRAM, SRAM, MRAM, RRAM, FRAM, Hybrid RAM, and the like. The DRAMs 2500*a* and 2500*b* have relatively low latency and high bandwidth than the input/output devices 2700*a* and 2700*b* or the flash memory devices 2600*a* and 2600*b*. The DRAMs 2500*a* and 2500*b* may be initialized at the power-on time point of the mobile system 2000, and when the operating system and application data are loaded, the DRAMs 2500*a* and 2500*b* may be used as temporary storage locations for the operating system and application data or as execution spaces for various software codes.

In the DRAMs 2500*a* and 2500*b*, addition/subtraction/multiplication/dividing arithmetic operations and vector operations, address operations, or FFT operations data may be stored. In another embodiment, the DRAMs 2500*a* and 2500*b* may be provided as a processing-in-memory (PIM) equipped with a calculation function. For example, a function for performing a function used for inference in the DRAMs 2500*a* and 2500*b* may be performed. In this case, the inference may be performed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, and a rectified linear unit (ReLU) function.

As an example embodiment, an image captured through the camera 2100 by a user may be signal-processed and stored in the DRAM 2500*b*, and the accelerator block 2820 or accelerator chip may perform AI data operation of recognizing data using data stored in the DRAM 2500*b* and the function used for inference.

According to an example embodiment, the mobile system 2000 may include a plurality of storage or a plurality of flash memory devices 2600*a* and 2600*b* having a larger capacity than the DRAMs 2500*a* and 2500*b*. The flash memory devices 2600*a* and 2600*b* may include the memory controller 2610 and the flash memory 2620. The memory controller 2610 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 2610 receives control commands and data from the AP 2800, writes data to the flash memory 2620 in response to the control command, or reads data stored in the flash memory 2620 to access the AP 2800 and may transmit the data to the AP 2800.

According to an example embodiment, the accelerator block 2820 or the accelerator chip may perform training operations and AI data calculation using the flash memory devices 2600*a* and 2600*b*. In an example embodiment, operation logic capable of executing a desired and/or alternatively predetermined operation inside the flash memory devices 2600*a* and 2600*b* may be implemented in the controller 2610, and the operation logic may execute at least a portion of the training operations and the operation of the inference AI data performed by the AP 2800 and/or the accelerator block 2820, in place, using the data stored in the flash memory 2620.

In an example embodiment, the AP 2800 may include an interface 2830, and accordingly, the flash memory devices 2600*a* and 2600*b* may be directly connected to the AP 2800. For example, the AP 2800 may be implemented as an SoC, the flash memory device 2600*a* may be implemented as a separate chip from the AP 2800, and the AP 2800 and the flash memory device 2600*a* may be mounted in one package. However, the example embodiments are not limited thereto, and the plurality of flash memory devices 2600*a* and 2600*b* may be electrically connected to the mobile system 2000 through a connection.

The flash memory devices 2600*a* and 2600*b* may store data such as still images/movies captured by the camera 2100, or may store data received through a communication network and/or ports included in the input/output devices 2700*a* and 2700*b*, and for example, may store Augmented Reality/Virtual Reality, High Definition (HD), or Ultra High Definition (UHD) contents.

At least one of the DRAM 2500*a* and 2500*b* and the flash memory devices 2600*a* and 2600*b* may be implemented as memory devices according to example embodiments. For example, at least one of the DRAMs 2500*a* and 2500*b* and the flash memory devices 2600*a* and 2600*b* may execute a verification operation according to example embodiments every desired and/or alternatively predetermined period, and may execute a refresh operation and/or a repair operation as required. Accordingly, the operating performance and reliability of the mobile system 2000 may be improved.

In the example embodiment illustrated in FIG. 31, various devices such as the AP 2800, the DRAMs 2500*a* and 2500*b*, and the flash memory devices 2600*a* and 2600*b* may be implemented in the same form as the semiconductor device according to the example embodiments. For example, among the input/output areas for inputting/outputting power and/or signals from the AP 2800, input/output areas adjacent to each other may be disposed in a vertical symmetrical relationship to secure a sufficient area between the input/output pins of the input/output areas. The input/output pins may be contacts for connecting wiring patterns inside the input/output areas to an uppermost redistribution layer.

Bumps may be disposed in an area secured between the input/output pins of the input/output areas. Accordingly, the degree of integration of the AP 2800 may be improved by reducing the area of a region in which the bumps are disposed. In addition, electrical characteristics may also be improved by reducing the length of the redistribution layer for connecting the bumps and the input/output pins.

As set forth above, according to an example embodiment, in at least a portion of input/output areas included in a semiconductor device, input/output pins connected to bumps may be disposed in different positions, and at least a portion of the bumps may be disposed between the input/output pins. Accordingly, the degree of integration of a semiconductor device may be improved by increasing the number of bumps that may be disposed in a limited area. In addition, by optimizing the arrangement of the input/output areas and the bumps to reduce the length of the wiring patterns connecting the input/output areas and pads, the electrical characteristics of the semiconductor device may also be improved.

While example embodiments have been illustrated and described above, it will be apparent to those skilled in the art that modifications and variations could be made without departing from the scope of inventive concepts as defined by the claims.

What is claimed is:

1. A semiconductor device comprising:
a substrate;
a plurality of input/output areas,
each of the plurality of input/output areas including semiconductor elements on the substrate and providing a logic circuit and an electrostatic discharge protection circuit, lower wiring patterns connected to the semiconductor elements, input/output pins above the lower wiring patterns and connected to the lower wiring patterns, and upper wiring patterns; and
a plurality of bumps above the lower wiring patterns and connected to the input/output pins by the upper wiring patterns, wherein
the plurality of input/output areas include a first input/output area and a second input/output area,
each of the plurality of input/output areas includes a first circuit area and a second circuit area,
the first circuit area includes the electrostatic discharge protection circuit,
the second circuit area includes the logic circuit, the input/output pins of the first input/output area are in the first circuit area of the first input/output area, and
the input/output pins of the second input/output area are in the second circuit area of the second input/output area.

2. The semiconductor device of claim 1, wherein
each of the plurality of input/output areas comprises an input/output wiring pattern in the second circuit area,
the input/output wiring pattern is connected to the logic circuit, and
the input/output wiring pattern is between the semiconductor elements and a corresponding one of the input/output pins in a direction perpendicular to an upper surface of the substrate.

3. The semiconductor device of claim 2, wherein
the first input/output area and the second input/output area are adjacent to each other in one direction,
the one direction is parallel to the upper surface of the substrate, and
the electrostatic discharge protection circuit of the second input/output area is between the input/output wiring pattern of the first input/output area and the logic circuit of the second input/output area in the one direction.

4. The semiconductor device of claim 2, wherein a distance between one of the input/output pins and the input/output wiring pattern in the first input/output area, in one direction parallel to the upper surface of the substrate, is greater than a distance between one of the input/output pins and the input/output wiring pattern in the second input/output area.

5. The semiconductor device of claim 1, wherein
the plurality of bumps comprise a first bump connected to the first input/output area and a second bump connected to the second input/output area,
the first input/output area and the second input/output area are adjacent to each other in a first direction parallel to an upper surface of the substrate, and
at least one of the first bump and the second bump is between one of the input/output pins of the first input/output area and one of the input/output pins of the second input/output area.

6. The semiconductor device of claim 5, wherein at least one of the first bump and the second bump overlaps at least one of the first input/output area and the second input/output area.

7. The semiconductor device of claim 6, wherein
at least one of the first bump and the second bump has an overlapping area and a non-overlapping area,
the overlapping area overlaps at least one of the first input/output area and the second input/output area,
the non-overlapping area that does not overlap the plurality of input/output areas, and
an area of the overlapping area is greater than an area of the non-overlapping area.

8. The semiconductor device of claim 1, wherein a first lower wiring pattern among the lower wiring patterns in the second input/output area traverses a boundary between the first circuit area and the second circuit area.

9. The semiconductor device of claim 8, wherein the first lower wiring pattern is in an uppermost layer among a plurality of layers including the lower wiring patterns.

10. The semiconductor device of claim 1, wherein
the plurality of input/output areas further comprise a third input/output area, and
in the third input/output area, an input/output pin overlaps a boundary between the first circuit area and the second circuit area.

11. A semiconductor device comprising:
a substrate having a first area and a second area surrounded by the first area;
a plurality of input/output areas in the first area,
the plurality of input/output areas arranged in a first direction parallel to an upper surface of the substrate and in a second direction different from the first direction,
each of the plurality of input/output areas including semiconductor elements providing an input/output circuit, lower wiring patterns connected to the semiconductor elements, an input/output pin connected to the lower wiring patterns, and upper wiring patterns,
such that the plurality of input/output areas have input/output pins;
a core region in the second area; and
a plurality of bumps connected to the input/output pins by the upper wiring patterns at a same height as the input/output pins, wherein
the lower wiring patterns provide an input/output wiring pattern connecting the input/output circuit to the core region, and
the plurality of input/output areas include a first input/output area and a second input/output area,
a distance between the input/output wiring pattern and the input/output pin in the first input/output area is a first distance,
a distance between the input/output wiring pattern and the input/output pin in the second input/output area is a second distance, and
the second distance is different from the first distance.

12. The semiconductor device of claim 11, wherein
the input/output pin in the first input/output area has a first height in the first direction and a first width in the second direction,
the input/output pin in the second input/output area has a second height and a second width,
the second height is lower than the first height in the first direction, and
the second width is greater than the first width in the second direction.

13. The semiconductor device of claim 12, wherein an area of the input/output pin included in the first input/output area is the same as an area of the input/output pin included in the second input/output area.

14. The semiconductor device of claim 12, wherein
the input/output pin included in the first input/output area is on an upper portion of one of an electrostatic discharge protection circuit and a logic circuit included in the first input/output area, and
the input/output pin included in the second input/output area overlaps a boundary between an electrostatic discharge protection circuit and a logic circuit included in the second input/output area.

15. The semiconductor device of claim 11, wherein
each of the plurality of input/output areas has a first boundary and a second boundary that are parallel to an edge of the substrate and are separated from each other,
the second boundary is closer to the core region than the first boundary, and
in each of the plurality of input/output areas, the input/output wiring pattern is closer to the second boundary than the first boundary.

16. The semiconductor device of claim 15, wherein, in at least one of the plurality of input/output areas, a distance between the input/output pin and the first boundary is the same as a distance between the input/output pin and the second boundary.

17. The semiconductor device of claim 11, wherein the plurality of input/output areas comprise:
horizontal input/output areas in which the input/output wiring pattern is connected to the core region in the first direction; and
vertical input/output areas in which the input/output wiring pattern is connected to the core region in the second direction,
wherein the input/output wiring pattern included in the horizontal input/output areas is at a first height from the upper surface of the substrate, and
the input/output wiring pattern included in the vertical input/output areas is at a second height different from the first height from the upper surface of the substrate.

18. A semiconductor device comprising:
a substrate;
a plurality of input/output areas in a first area of the substrate;
a core region connected to the plurality of input/output areas, the core region being configured to receive an input signal from the plurality of input/output areas or to transmit an output signal to the plurality of input/output areas; and
a plurality of bumps electrically connected to the input/output areas,
wherein each of the plurality of input/output areas includes a logic circuit area, a protection circuit area, and writing patterns connecting one of the plurality of bumps to the protection circuit area,
the logic circuit area includes an input/output wiring pattern connected to the core region,
the protection circuit area is connected to at least one of the plurality of bumps,
the writing patterns are different from the input/output wiring pattern, and
in at least one of the plurality of input/output areas, at least one of the wiring patterns traverses a boundary between the logic circuit area and the protection circuit area.

19. The semiconductor device of claim 18, wherein
in each of the plurality of input/output areas, the logic circuit area and the protection circuit area are arranged in a same order.

20. The semiconductor device of claim 18, wherein
in each of a first portion of the plurality of input/output areas, the logic circuit area is closer to the core region than the protection circuit area, and
in each of a second portion of the plurality of input/output areas, the protection circuit area is closer to the core region than the logic circuit area.

* * * * *